(12) United States Patent
Tokiwa

(10) Patent No.: US 10,140,059 B2
(45) Date of Patent: Nov. 27, 2018

(54) SEMICONDUCTOR MEMORY DEVICE AND MEMORY SYSTEM

(71) Applicant: Toshiba Memory Corporation, Tokyo (JP)

(72) Inventor: Naoya Tokiwa, Fujisawa Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 34 days.

(21) Appl. No.: 15/181,227

(22) Filed: Jun. 13, 2016

(65) Prior Publication Data

US 2017/0052737 A1 Feb. 23, 2017

(30) Foreign Application Priority Data

Aug. 17, 2015 (JP) .................................. 2015-160623

(51) Int. Cl.
*G06F 3/06* (2006.01)
*G06F 12/02* (2006.01)
(Continued)

(52) U.S. Cl.
CPC ............ *G06F 3/0659* (2013.01); *G06F 3/061* (2013.01); *G06F 3/0679* (2013.01);
(Continued)

(58) Field of Classification Search
CPC ...... G06F 3/0679; G06F 3/061; G06F 3/0659; G06F 12/0802; G06F 2212/60;
(Continued)

(56) References Cited

U.S. PATENT DOCUMENTS 5,361,391 A * 11/1994 Westberg ............ G06F 12/0862
711/137
7,808,825 B2 10/2010 Park
(Continued)

FOREIGN PATENT DOCUMENTS

EP 2225759 A1 9/2010
JP 2004192789 A 7/2004
(Continued)

OTHER PUBLICATIONS

Taiwan Office Action dated Jul. 31, 2017, filed in Taiwan counterpart Application No. 105107334, 13 pages (with translation).
(Continued)

*Primary Examiner* — Hiep Nguyen
(74) *Attorney, Agent, or Firm* — Patterson & Sheridan, LLP

(57) ABSTRACT

A memory system includes a semiconductor memory device including a plurality of memory cells, and a memory controller. The semiconductor memory device includes first, second, and third caches for storing data before the data are written into the memory cells. The memory controller is configured to issue commands to the semiconductor memory device, the commands including a first command issued with write data to store the write data in the first cache and a second command issued with write data to store the write data in the first cache and then transfer the write data in the first cache to one of the second and third caches.

20 Claims, 35 Drawing Sheets

(51) Int. Cl.
*G06F 12/0802* (2016.01)
*G11C 16/32* (2006.01)
*G06F 13/16* (2006.01)

(52) U.S. Cl.
CPC ...... *G06F 12/0246* (2013.01); *G06F 12/0802* (2013.01); *G11C 16/32* (2013.01); *G06F 3/06* (2013.01); *G06F 13/1673* (2013.01); *G06F 2212/1024* (2013.01); *G06F 2212/2022* (2013.01); *G06F 2212/60* (2013.01); *G06F 2212/7203* (2013.01); *G06F 2212/7208* (2013.01); *G11C 2207/2245* (2013.01)

(58) Field of Classification Search
CPC ............... G06F 2212/2022; G06F 3/06; G06F 2212/1024; G06F 2212/7203; G06F 2212/7208; G06F 12/0246; G06F 13/1673; G11C 16/32; G11C 2207/2224
See application file for complete search history.

(56) References Cited

U.S. PATENT DOCUMENTS

| | | | |
|---|---|---|---|
| 8,027,195 | B2 | 9/2011 | Li et al. |
| 9,478,261 | B1* | 10/2016 | Lim ..................... G11C 7/1057 |
| 2009/0157946 | A1 | 6/2009 | Arya |
| 2009/0267128 | A1 | 10/2009 | Maejima |
| 2009/0268522 | A1 | 10/2009 | Maejima |
| 2009/0282187 | A1 | 11/2009 | Ito et al. |
| 2010/0207195 | A1 | 8/2010 | Fukuzumi et al. |
| 2010/0214838 | A1 | 8/2010 | Hishida et al. |
| 2011/0055457 | A1 | 3/2011 | Yeh |
| 2011/0235431 | A1* | 9/2011 | Takagiwa ............ G11C 11/5642 |
| | | | 365/185.22 |
| 2011/0284946 | A1 | 11/2011 | Kiyotoshi |
| 2012/0069663 | A1 | 3/2012 | Itagaki et al. |
| 2013/0080680 | A1 | 3/2013 | Chu |
| 2013/0205074 | A1 | 8/2013 | Chung et al. |
| 2013/0262745 | A1 | 10/2013 | Lin et al. |
| 2013/0297987 | A1 | 11/2013 | Gupta et al. |
| 2014/0082266 | A1 | 3/2014 | Fujiu |
| 2014/0085983 | A1 | 3/2014 | Hosono |
| 2014/0247664 | A1 | 9/2014 | Hosono et al. |
| 2015/0070989 | A1 | 3/2015 | Funatsuki et al. |

FOREIGN PATENT DOCUMENTS

| | | |
|---|---|---|
| JP | 2006-073141 A | 3/2006 |
| JP | 2007-157315 A | 6/2007 |
| JP | 2009-158061 A | 7/2009 |
| JP | 2015-056199 A | 3/2015 |
| TW | 201108231 A | 3/2011 |
| TW | I375151 B | 10/2012 |
| WO | 2009083945 A1 | 7/2009 |

OTHER PUBLICATIONS

Anonymous: "Cache (computing)—Wikipedia, the free encyclopedia", Nov. 5, 2012 (Nov. 5, 2012), pp. 1-6, XP055287582, Retrieved from the Internet:URL:https://en.wikipedia.ort/w/index.php?itle=Cache_(computing)&oldid=521524262 [retrieved on Jul. 12, 2016].
European Search Report dated Sep. 5, 2016, mailed in counterpart European Application No. 16180324.2, 11 pages.
Japanese Office Action dated May 8, 2018 in related Japanese Patent Application 2015-160623.
European Office Action dated Jan. 25, 2018, filed in European counterpart Application No. 16180324.2, 6 pages (with translation).

* cited by examiner

FIG. 7

| SIGNAL TYPE | (1) AFTER DC3 | (2) AFTER TC2 | (3) AFTER DC3 | (4) AFTER C4 |
|---|---|---|---|---|
| DoPLN0 | L | H | H | H |
| DoPLN1 | H | H | L | H |
| PLN0_PG2 | L | L | H | H |
| PLN1_PG2 | L | L | L | H |
| CMD_TC2 | L | H | L | L |

FIG. 9

| SIGNAL TYPE | (1) AFTER TC2 | (2) AFTER TC5 | (3) AFTER TC2 | (4) AFTER TC2 | (5) AFTER TC2 | (6) AFTER C4 |
|---|---|---|---|---|---|---|
| DoPLN0 | H | H | L | H | L | L |
| DoPLN1 | L | L | H | L | H | H |
| PLN0_PG2 | L | L | L | H | L | L |
| PLN1_PG2 | L | L | L | L | L | H |
| CMD_TC2 | H | L | H | H | H | L |
| CMD_TC5 | L | H | L | L | L | L |

FIG. 11

| SIGNAL TYPE | (1) AFTER TC9 | (2) AFTER DC3 | (3) AFTER C4 |
|---|---|---|---|
| DoPLN0 | H | H | H |
| DoPLN1 | L | L | H |
| PLN0_PG2 | L | H | H |
| PLN1_PG2 | L | L | H |
| CMD_TC2 | L | L | L |
| CMD_TC9 | H | L | L |

FIG. 13

| SIGNAL TYPE | (1) AFTER TC2 | (2) AFTER TC2 | (3) AFTER TC7 | (4) AFTER C4 |
|---|---|---|---|---|
| DoPLN0 | H | H | H | L |
| DoPLN1 | L | L | L | L |
| PLN0_PG2 | L | H | L | L |
| PLN1_PG2 | L | L | L | L |
| CMD_TC2 | H | H | L | L |
| CMD_TC7 | L | L | H | L |

FIG. 15

| SIGNAL TYPE | (1) AFTER TC2 | (2) AFTER C4 |
|---|---|---|
| DoPLN0 | H | H |
| DoPLN1 | L | L |
| PLN0_PG2 | H | L |
| PLN1_PG2 | L | L |
| CMD_TC2 | H | L |

FIG. 17

| SIGNAL TYPE | (1) AFTER TC2 | (2) AFTER TC2 | (3) AFTER TC8 | (4) AFTER C4 |
|---|---|---|---|---|
| DoPLN0 | H | H | H | L |
| DoPLN1 | L | L | L | L |
| PLN0_PG2 | L | H | L | L |
| PLN1_PG2 | L | L | L | L |
| CMD_TC2 | H | H | L | L |
| CMD_TC8 | L | L | H | L |

FIG. 21

| SIGNAL TYPE | (1) AFTER TC3 | (2) AFTER TC2 | (3) AFTER TC3 | (4) AFTER C4 |
|---|---|---|---|---|
| DoPLN0 | L | H | H | L |
| DoPLN1 | H | L | L | H |
| PLN0_PG2 | L | L | H | L |
| PLN1_PG2 | L | L | L | H |
| CMD_TC2 | H | H | H | L |

FIG. 34

|  | bit7 | bit6 | bit5 | bit4 | bit3 | bit2 | bit1 | bit0 |
|---|---|---|---|---|---|---|---|---|
| Lower page program data | 1 | 0 | 1 | 0 | 1 | 0 | 1 | 0 |
| Lower page program result | P | F | P | P | P | F | P | P |
| Upper page program data | 1 | 1 | 1 | 1 | 0 | 0 | 0 | 0 |
| Vth distribution | E | C | E | C | A | B | A | B |
| Lower page program data (modified) | 1 | 0 | 1 | 0 | 1 | 1 | 1 | 0 |
| Upper page program data | 1 | 1 | 1 | 1 | 0 | 0 | 0 | 0 |

FIG. 35

|  | bit7 | bit6 | bit5 | bit4 | bit3 | bit2 | bit1 | bit0 |
|---|---|---|---|---|---|---|---|---|
| Lower page program data | 1 | 0 | 1 | 0 | 1 | 0 | 1 | 0 |
| Lower page program result | P | F | P | P | P | F | P | P |
| Upper page program data | 1 | 1 | 1 | 1 | 0 | 0 | 0 | 0 |
| Vth distribution | E | C | E | C | A | B | A | B |
| Lower page program data (modified) | 1 | 1 | 1 | 0 | 1 | 1 | 1 | 0 |
| Upper page program data | 1 | 1 | 1 | 1 | 0 | 0 | 0 | 0 |

FIG. 36

| | bit7 | bit6 | bit5 | bit4 | bit3 | bit2 | bit1 | bit0 |
|---|---|---|---|---|---|---|---|---|
| Lower page program data | 1 | 0 | 1 | 0 | 1 | 0 | 1 | 0 |
| Lower page program result | P | F | P | P | P | F | P | P |
| Upper page program data | 1 | 1 | 1 | 1 | 0 | 0 | 0 | 0 |
| Vth distribution | E | C | E | C | A | B | A | B |
| A verify | | | | | | | | |
| B verify | | | | | | | 1 | |
| C verify | | 1 | | | | | | |
| Upper page verify | | 1 | | | | 1 | | |

SEMICONDUCTOR MEMORY DEVICE AND MEMORY SYSTEM

CROSS-REFERENCE TO RELATED APPLICATION

This application is based upon and claims the benefit of priority from Japanese Patent Application No. 2015-160623, filed Aug. 17, 2015, the entire contents of which are incorporated herein by reference.

FIELD

Embodiments described herein relate generally to a semiconductor memory device and a memory system.

BACKGROUND

A NAND flash memory is known as a semiconductor memory device.

DESCRIPTION OF THE DRAWINGS

FIG. 7 illustrates logic states of control signals used in the semiconductor memory device according to the first embodiment.

FIG. 9 illustrates logic states of control signals used in a semiconductor memory device according to the second embodiment.

FIG. 11 illustrates logic states of control signals used in the semiconductor memory device according to the third embodiment.

FIG. 13 illustrates logic states of control signals used in the semiconductor memory device according to the fourth embodiment.

FIG. 15 illustrates logic states of control signals used in the semiconductor memory device according to the fifth embodiment.

FIG. 17 illustrates logic states of control signals in the semiconductor memory device according to the sixth embodiment.

FIG. 21 illustrates logic states of control signals used in a semiconductor memory device according to the second modification example.

FIG. 34 illustrates a method of changing lower page data according to the tenth embodiment.

FIG. 35 is a diagram showing the method of changing lower and upper page data according to the tenth embodiment.

FIG. 36 illustrates a method of processing write data according to the tenth embodiment.

DETAILED DESCRIPTION

Figure 1:
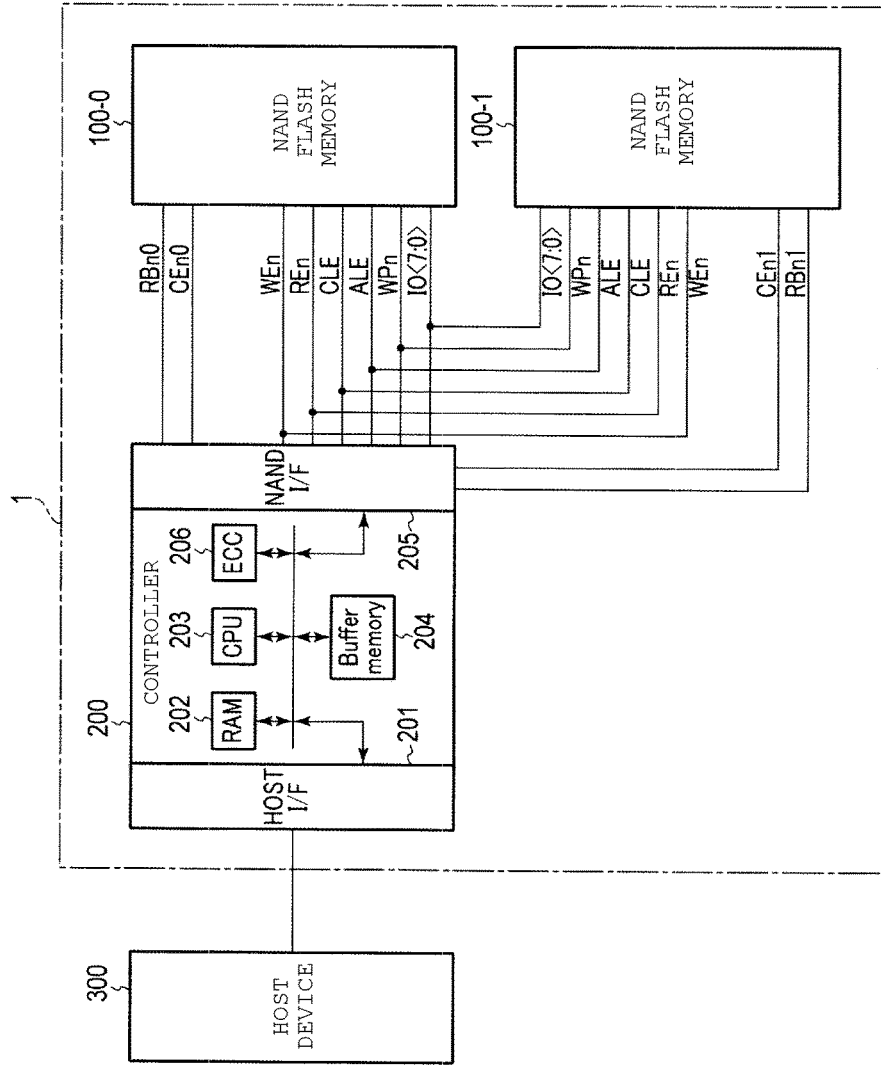
FIG. 1 is a block diagram of a memory system according to a first embodiment.

Embodiments provide a semiconductor memory device and a memory system capable of improving processing capability.

In general, according to one embodiment, there is provided a memory system that includes a semiconductor memory device including a plurality of memory cells, and a memory controller. The semiconductor memory device includes first, second, and third caches for storing data before the data are written into the memory cells. The memory controller is configured to issue commands to the semiconductor memory device, the commands including a first command issued with write data to store the write data in the first cache and a second command issued with write data to store the write data in the first cache and then transfer the write data in the first cache to one of the second and third caches.

Hereinafter, embodiments will be described with reference to the drawings. Throughout the drawings, common elements will be assigned common reference numerals in the following description.

1. First Embodiment

A semiconductor memory device and a memory system according to a first embodiment will be described. In the following description, it will be described that a plane NAND flash memory in which memory cell transistors are two-dimensionally arranged on a semiconductor substrate is used as an example of the semiconductor memory device.

1.1 Configuration

1.1.1 Entire Configuration of Memory System

Initially, the entire configuration of a memory system according to the present embodiment will be described with reference to FIG. 1.

As shown in FIG. 1, a memory system 1 includes, for example, a plurality of NAND flash memories 100, one controller 200, and one host device 300. In FIG. 1 and the following description, two NAND flash memories 100 (100_0 and 100_1) are used. However, one or three or more NAND flash memories 100 may be connected to the controller 200.

Each of the NAND flash memories 100 includes a plurality of memory cell transistors, and can store data in a nonvolatile manner. The NAND flash memories 100 are connected to the controller 200 through NAND buses, and are operated based on commands from the controller 200. That is, each of the NAND flash memories 100 transmits and receives, for example, an 8-bit input and output signal IO<7:0> to and from the controller 200. The input and output signal IO<7:0> is, for example, a command, an address signal, and data. The NAND flash memories 100 receive control signals from the controller 200, and transmit state code signals.

The control signal includes chip enable signals CEn0 and CEn1, a write enable signal WEn, a read enable signal REn, a command latch enable signal CLE, an address latch enable signal ALE, and a write protect signal WPn. The signals WEn, REn, CLE, ALE, and WPn are received by the NAND flash memories 100_0 and 100_1. Meanwhile, the signal CEn0 is received by the NAND flash memory 100_0, and the signal CEn1 is received by the NAND flash memory 100_1.

The signals CEn (CEn0 and CEn1) are signals to cause the NAND flash memory 100 that receives this signal to be in an enable state, and are asserted at an "L" level. The write enable signal WEn is a signal to cause the NAND flash memory 100 that receives this signal to acquire the input and output signal IO<7:0>, and is asserted at an "L" level. Thus, whenever the WEn is toggled, the input and output signal IO<7:0> is introduced to the NAND flash memory 100. The signal REn is a signal to cause the NAND flash memory 100 that receives this signal to output the input and output signal IO<7:0>, and is asserted at an "L" level. The signal CLE is a signal indicting that the input and output signal IO<7:0> is a command, and is asserted at an "H" level. The signal ALE is a signal indicating that the input and output signal IO<7:0> is an address signal, and is asserted at an "H" level. The signal WPn is a signal for commanding the NAND flash memory 100 which receives this signal to prohibit the introduction of the input and output signal IO<7:0>, and is asserted at an "L" level.

The state code signal indicates various states of the NAND flash memory 100, and includes ready/busy signals RBn (RBn0 and RBn1). The ready/busy signal RBn is a signal indicating whether or not the NAND flash memory 100 is in a busy state (a state in which it is not possible to receive the command from the controller 200 or a state in which it is possible to receive the command), and becomes an "L" level in the busy state. The signal RBn0 is output from the NAND flash memory 100_0, and the signal RBn1 is output from the NAND flash memory 100_1. The controller 200 can check the state of each of the NAND flash memories 100 by receiving the state code signal.

The controller 200 commands the NAND flash memory 100 to write, read, and erase based on a command from the host device 300.

The controller 200 includes a host interface circuit 201, a memory (RAM) 202, a processor (CPU) 203, a buffer memory 204, a NAND interface circuit 205, and an error correction code (ECC) circuit 206.

For example, the host interface circuit 201 is connected to the host device 300 through a control bus such as a SD card bus or a PCIe bus, and manages communication between the controller 200 and the host device 300.

The NAND interface circuit 205 is connected to each of the NAND flash memories 100 through a NAND bus, and manages communication between the controller 200 and the NAND flash memory 100.

The CPU 203 controls the entire operation of the controller 200.

The memory 202 is, for example, a dynamic random access memory (DRAM), and is used as a work memory of the CPU 203.

The buffer memory 204 temporarily stores data transmitted to the NAND flash memory 100 and data transmitted from the NAND flash memory 100.

The ECC circuit 206 detects and corrects an error of data by using an error-correcting code.

1.1.2 Configuration of Semiconductor Memory Device

Hereinafter, the configuration of the semiconductor memory device will be described with reference to FIG. 2.

Figure 2:
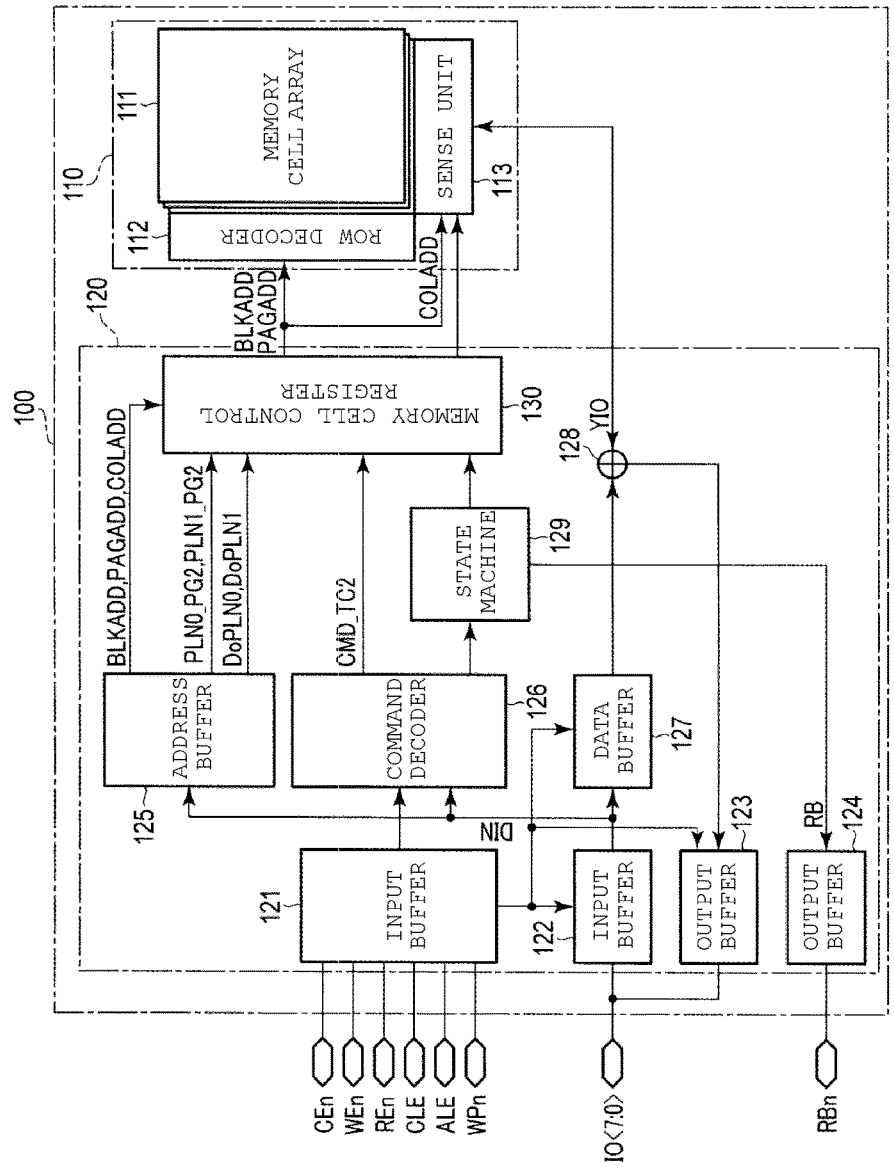
FIG. 2 is a block diagram of a semiconductor memory device of the memory system according to the first embodiment.

As shown in FIG. 2, the NAND flash memory 100 includes a core module 110, and a peripheral circuit 120.

The core module 110 may include a memory cell array 111, a row decoder 112, and a sense unit 113. The core module 110 may include a plurality of memory cell arrays 111.

The memory cell array 111 includes a plurality of memory cell transistors, and stores data in a nonvolatile manner.

For example, at the time of writing and reading data, the row decoder 112 decodes a block address BLKADD or a page address PAGADD, and selects a target word line.

The sense unit 113 outputs data in a selected column of the memory cell array 111 based on a column address COLADD at the time of reading, and transmits write data transmitted from a data buffer 127 to the memory cell array 111 at the time of writing. The sense unit 113 includes a cache and a sense amplifier. The cache is plural in number, and temporarily stores data. The sense amplifier senses data read from the memory cell transistor into a bit line at the time of reading data. The sense amplifier transmits write data to the memory cell transistor at the time of writing data.

The peripheral circuit 120 includes input buffers 121 and 122, output buffers 123 and 124, an address buffer 125, a command decoder 126, a data buffer 127, a selector 128, a state machine 129, and a memory cell control register 130.

The input buffer 121 is connected to an input pin which receives the above-described control signals (the chip enable signal CEn, the write enable signal WEn, the read enable signal REn, the command latch enable signal CLE, the address latch enable signal ALE, and the write protect signal WPn). The input buffer 121 controls the input buffer 122, the output buffer 123, the command decoder 126, or the data buffer 127 based on the control signals.

The input buffer 122 is connected to an input and output pin (terminal) which inputs and outputs the input and output signal IO<7:0>. The input buffer 122 transmits the address signal as a signal DIN to the address buffer 125 based on the control of the input buffer 121, transmits the command as the signal DIN to the command decoder 126, and transmits the data as the signal DIN to the data buffer 127.

The output buffer 123 is connected to an input and output pin (terminal) for input and output. The output buffer 123 outputs read data read from the memory cell array 111, as the input and output signal IO<7:0>, to the controller 200 based on the control of the input buffer 121.

The output buffer 124 is connected to an output pin which outputs the ready/busy signal RBn. The output buffer 124 transmits the ready/busy signal RB received from the state machine 129, as the ready/busy signal RBn, to the controller 200.

The address buffer 125 temporarily stores the address signal received from the controller 200 via the input buffer 122. The address buffer 125 transmits a row address (a block address BLKADD and/or a page address PAGADD), a column address COLADD, a signal PLN0_PG2, a signal PLN1_PG2, a signal DoPLN0, and a signal DoPLN1 to the memory cell control register 130. The signal PLN0_PG2, the signal PLN1_PG2, the signal DoPLN0, and the signal DoPLN1 are control signals for designating a target cache within the sense unit 113, and the details thereof will be described below.

For example, the page address PAGADD may include a word line WL, odd/even numbered bit lines E/O, a string address, or information regarding lower page/intermediate page/upper page (L/M/U).

For example, the configuration of the page address is described in U.S. patent application Ser. No. 13/784,753 which is titled "NONVOLATILE SEMICONDUCTOR MEMORY DEVICE AND CONTROL METHOD THEREOF" and is filed on Mar. 4, 2013. The present patent application is herein incorporated by reference in its entirety.

The command decoder 126 decodes various commands received from the input buffer 121. The command decoder 126 transmits a signal CMD_TC2 to the memory cell control register 130 based on the decoding result. The signal CMD_TC2 is a control signal for commanding transmission of data into a cache of sense unit 113 and then between caches of the sense unit 113. The command decoder 126 transmits the decoding result to the state machine 129.

The data buffer 127 temporarily stores data (write data) received from the controller 200. The data buffer 127 transmits data the sense unit 113 via the selector 128.

The selector 128 determines a data direction of a bidirectional bus YIO, transmits the write data to the sense unit 113 from the data buffer 127, and transmits read data to the output buffer 123 from the sense unit 113.

The state machine 129 manages the writing, reading, and erasing in response to the decoding result of the command decoder 126. The state machine 129 transmits the control signal to the memory cell control register 130, and transmits the ready/busy signal RB to the output buffer 124 depending to an operation state of the core module 110.

The memory cell control register 130 respectively transmits the row address (the block address BLKADD and/or the page address PAGADD) and the column address COLADD received from the address buffer 125 to the row decoder 112 and the sense unit 113. The memory cell control register 130 transmits the control signals received from the address buffer 125, the command decoder 126, and the state machine 129, to the sense unit 113.

In FIG. 2, partial connections between the respective blocks are represented by arrow lines, but connections between the blocks are not limited thereto.

1.1.3 Configuration of Core Module

Figure 3:
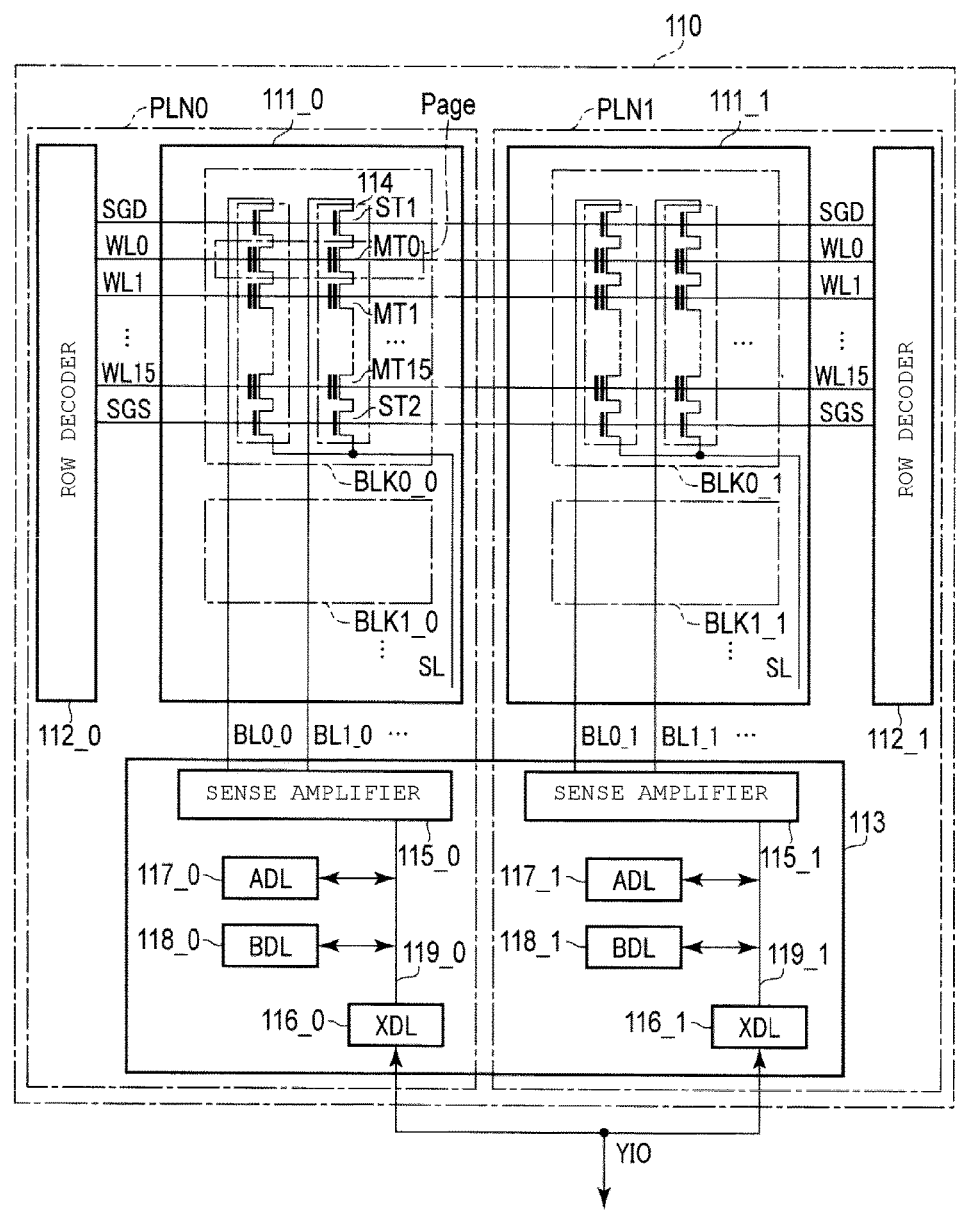
FIG. 3 is a block diagram of a core module of the semiconductor memory device according to the first embodiment.

Hereinafter, the configuration of the core module 110 will be described with reference to FIG. 3. In FIG. 3, the core module includes two memory cell arrays 111.

As shown in FIG. 3, the core module 110 includes two planes PLN0 and PLN1. The plane PLN is a unit of writing data in the memory cell transistor and reading data from the memory cell transistor MT. The planes PLN0 and PLN1 may be independently operated from each other, or may be simultaneously operated. The number of planes PLN is not limited to two, but may be one or three or more.

Each of the planes PLN includes a memory cell array 111 and a row decoder 112. In the following description, the memory cell array of the plane PLN0 is denoted by 111_0, and the row decoder is denoted by 112_0. The memory cell array of the plane PLN1 is denoted by 111_1, and the row decoder is denoted by 112_1. The respective planes PLN are connected to the sense unit 113.

The memory cell array 111 includes a plurality of blocks BLK which is a set of a plurality of nonvolatile memory cell transistors. For example, data stored in the memory cell transistor MT is erased for every block BLK. In the following description, the block BLK of the plane PLN0 is denoted by BLKm_0 (m is an integer of 0 or more), and the block BLK of the plane PLN1 is denoted by BLKm_1. The blocks BLK in the planes PLN may be different, and the number of blocks is not limited.

Each of the blocks BLK includes a plurality of NAND strings 114 in which the memory cell transistors are connected in series. Each of the NAND strings 114 includes, for example, 16 memory cell transistors MT (MT0 to MT15) and selection transistors ST1 and ST2. The memory cell transistor MT includes a control gate and a charge storage layer, and stores data in a nonvolatile manner. The memory cell transistor MT may be a MONOS type using an insulating film as the charge storage layer, or may be a FG type using a conductive film as the charge storage layer. The number of memory cell transistors MT is not limited to 16, and may be 8, 32, 64, or 128. The number of memory cell transistors is not limited.

The current paths of the memory cell transistors MT0 to MT15 are connected in series. A drain of the memory cell transistor MT0 at one end of the series connection is connected to a source of the selection transistor ST1, and a source of the memory cell transistor MT15 at the other end thereof is connected to a drain of the selection transistor ST2.

Gates of the selection transistors ST1 within the same block BLK are connected in common to the same select gate line SGD. Similarly, gates of the selection transistors ST2 within the same block BLK are connected in common to the same select gate line SGS.

The control gates of the memory cell transistors MT of the NAND strings 114 within the BLK are connected in common to different word lines WL0 to WL15.

The drains of the selection transistors ST1 of the NAND strings 114 in the same column are connected in common to any bit line BL. That is, the bit line BL connects the NAND strings 114 between the plurality of blocks BLK in common. Hereinafter, the bit line BL of the plane PLN0 is denoted by BLk_0 (k is an integer of 0 or more), and the bit line BL of the plane PLN1 is denoted by BLk_1. The number of bit lines BL may be different between the plane 0 and the plane 1, and the number of bit lines is not limited.

Sources of the selection transistors ST2 within the blocks BLK within the plane PLN are connected in common to a source line SL. The source lines SL of the plane PLN0 and PLN1 may be connected in common and may be connected to a source line driver (not shown), or the source lines of the planes PLN may be connected different source lines drives.

Although the memory cell transistors MT are two-dimensionally arranged on the semiconductor substrate in this example, the memory cell transistors may be three-dimensionally stacked above the semiconductor substrate.

For example, the configuration of the memory cell array 111 in the three-dimensional stacked NAND flash memory is described in U.S. patent application Ser. No. 12/407,403 which is titled "THREE-DIMENSIONAL STACKED NONVOLATILE SEMICONDUCTOR MEMORY" and is filed on Mar. 19, 2009. The configuration of the memory cell array 111 in the three-dimensional stacked NAND flash memory is described in U.S. patent application Ser. No. 12/406,524 which is titled "THREE-DIMENSIONAL STACKED NONVOLATILE SEMICONDUCTOR MEMORY" and is filed on Mar. 18, 2009, U.S. patent application Ser. No. 12/679,991 which is titled "NONVOLATILE SEMICONDUCTOR MEMORY DEVICE AND MANUFACTURING METHOD THEREOF" and is filed on Mar. 25, 2010, and U.S. patent application Ser. No. 12/532,030 which is titled "SEMICONDUCTOR MEMORY DEVICE AND MANUFACTURING METHOD THEREOF" and is filed on Mar. 23, 2009. The present patent applications are herein incorporated by reference in their entirety.

A range in which data are erased is not limited to one block BLK, but a plurality of blocks BLK may be collectively erased, or a partial region which one block BLK may be collectively erased.

For example, the erasing of data is described in U.S. patent application Ser. No. 12/694,690 which is titled "NONVOLATILE SEMICONDUCTOR MEMORY DEVICE" and is filed on Jan. 27, 2010. The erasing of data is described in U.S. patent application Ser. No. 13/235,389 which is titled "NONVOLATILE SEMICONDUCTOR MEMORY DEVICE" and is filed on Sep. 18, 2011. These present patent applications are herein incorporated by reference in their entirety.

Hereinafter, the configuration of the sense units 113 will be described.

The sense unit 113 includes sense amplifiers 115 (115_0 and 115_1), first caches (XDLs) 116 (116_0 and 116_1), second caches (ADLs) 117 (117_0 and 117_1), and third caches (BDLs) 118 (118_0 and 118_1) which correspond to the respective planes PLN. The number of caches corresponding to the respective planes PLN may be arbitrarily set, and may be different by, for example, the number of bits of the data stored in the memory cell transistor MT.

The sense amplifier 115 is connected to the bit lines BL within the plane PLN and internal buses 119 (119_0 and 119_1). At the time of writing, the sense amplifier 115 outputs data input from the internal bus 119, more specifically, data stored in, for example, the second caches 117 and/or the third caches 118 to the bit lines BL. The sense amplifier 115 outputs data read from the bit lines BL to the internal buses 119 at the time of reading. Hereinafter, data read and written by the sense amplifier 115 from one plane PLN collectively is referred to as a "page". Thus, the plurality of memory cell transistors MT connected to the selection word line WL and the selection bit line BL at the time of writing and reading serves as a memory cell unit configuring one page. Although the sense amplifier 115 is provided for each plane PLN in the present embodiment, one common sense amplifier 115 may be provided for each plane PLN.

The first to third caches 116 to 118 have a size of bytes required for the sense amplifier 115 to perform the writing and reading collectively, and can store, for example, 16K-byte data. 16K bytes are accurately 16,384 bytes. The first to third caches 116 to 118 may include a surplus region of 16K bytes, for example, 512 bytes.

The first cache 116 is connected to the internal bus 119 and the bidirectional bus YIO. The first cache 116 stores the write data received through the bidirectional bus YIO at the time of writing. The sense unit 113 transmits the data stored in the first cache 116 to the second cache 117 or the third cache 118 in response to the control signal from the memory cell control register 130. The first cache 116 stores the read data received through the internal bus 119 at the time of reading. The sense unit 113 transmits the data stored in the first cache 116 to the output buffer 123 through the bidirectional bus YIO in response to the control signal from the memory cell control register 130.

The second cache 117 is connected to the internal bus 119, and stores the received data therein. The data stored in the second cache 117 are transmitted and received between the second cache and the sense amplifier 115, the first cache 116 or the third cache 118 in response to the control signal from the memory cell control register 130. The same is true of the third cache 118.

1.2 Threshold Voltage Distribution of Memory Cell Transistors

Hereinafter, the threshold voltage distribution of the memory cell transistors MT when 2-bit data can be stored will be described with reference to FIG. 4. Hereinafter, although the memory cell transistor MT can store 2-bit data in the present embodiment, data having a data length of 1 bit or 3 or more bits may be used. The number of bit to be stored is not limited.

Figure 4:
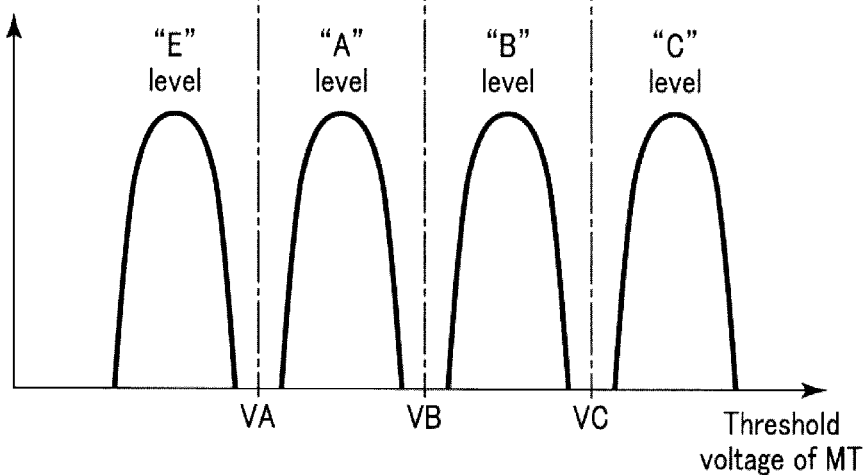
FIG. 4 illustrates a threshold voltage distribution when a memory cell transistor is able to store 2-bit data in the semiconductor memory device according to the first embodiment and values of the stored 2-bit data.

Threshold voltages of the memory cell transistors MT shown in FIG. 4 can store 2-bit data including an upper bit (or upper data) and a lower bit (lower data), that is, "11", "01", "00", and "10".

The threshold voltage of data "11" is an "E" level, and is less than the voltage VA.

The threshold voltages of "01", "00", and "10" are respectively "A", "B", and "C" levels. These threshold voltages have the relationship of "E" level<"A" level<"B" level<"C" level. The "A" level is a voltage which is equal to or greater than the voltage VA and is less than a voltage VB, the "B" level is a voltage which is equal to or greater than the voltage VB and is less than a voltage VC, and the "C" level is a voltage which is equal to or greater than the voltage VC. The relationship between the data and the threshold voltage level is not limited thereto, and may be arbitrarily changed.

When the memory cell transistor MT stores 2-bit data, data corresponding to the upper bit and data corresponding to the lower bit are allocated to one page. Hereinafter, a page in which lower-bit data are collectively written or read is referred to as a first page, and a page in which upper-bit data are collectively written or read is referred to as a second page.

1.3 Write Operation

Hereinafter, the write operation according to the present embodiment will be described by especially focusing on a case where the first page data and the second page data are simultaneously written in the planes PLN0 and PLN1 (hereinafter, referred to as "full sequence"). Hereinafter, a case where the writing is performed on the plane PLN0 and PLN1 in the full sequence is referred to as "multi-plane program".

For example, when the full sequence is performed, the controller 200 transmits data for each page to the NAND flash memory 100. Accordingly, in the multi-plane program, since as many data as four pages (the first and second pages of the plane PLN0 and the first and second pages of the plane PLN1) are programmed, the controller 200 transmits data of one page four times. As many received data as four pages are stored in a target cache, the NAND flash memory 100 writes the data in the memory cell array 111. More specifically, the NAND flash memory 100 stores the data for the first and second pages of the plane PLN0 in the second cache 117_0 and the third cache 118_0, stores the data for the first and second pages of the plane PLN1 in the second cache 117_1 and the third cache 118_1, and starts writing the whole data in the memory cell array 111_0 and 111_1 of the plane PLN0 and PLN1.

The write operation may be individually performed on the first page and the second page, or may be individually performed on the planes PLN.

1.3.1 Operation of Controller 200 at the Time of Transmitting Write Data

Figure 5:
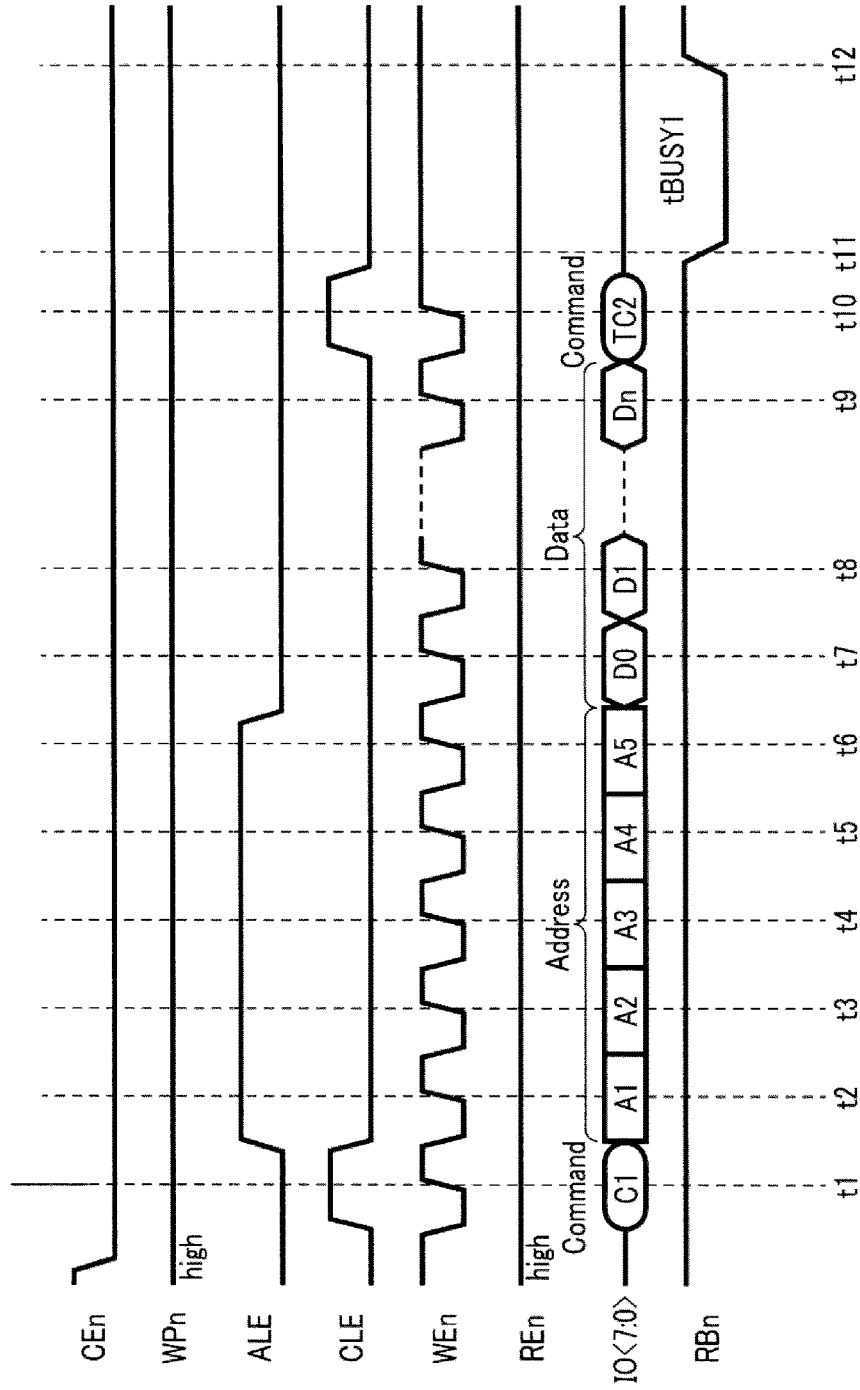
FIG. 5 is a timing chart of signals when data are transmitted from a controller to the semiconductor memory device in the memory system according to the first embodiment.

Initially, the operation of the controller 200 at the time of transmitting write data will be described with reference to FIG. 5. In FIG. 5, the controller 200 transmits as many data as one page to the NAND flash memory 100 and commands the NAND flash memory to store the data in the second cache 117 or the third cache 118.

As shown in FIG. 5, initially, the controller 200 sets the chip enable signal CEn to be at an "L" level and sets the write protect signal WPn to be at an "H" level before the operation.

Subsequently, at time t1, the controller 200 outputs a command "C1" to the NAND flash memory 100, and asserts the command latch enable signal CLE (to be at an "H" level). The command "C1" is a command for notifying that the address signal and/or the write data are transmitted.

Thereafter, at a time zone of t2 to t6, the controller 200 outputs the address signals "A1" to "A5", and asserts the address latch enable signal ALE (to be at an "H" level). The address signal includes the column address COLADD, the row address (BLKADD or PAGADD), and information indicating the first page or the second page. In FIG. 5, the address signals are transmitted at 5 cycles, but are not limited thereto. Any number of cycles required to transmit the address signals may be used.

Subsequently, at a time zone of t7 to t9, the controller 200 outputs data "D0" to "Dn" (n is an integer of 0 or more).

Thereafter, at time of t10, the controller 200 outputs, for example, a command "TC2", and asserts the command latch enable signal CLE. The command "TC2" is a command for writing data in the first cache 116 and transferring the data stored in the first cache 116 to the second cache 117 or the third cache 118 in the plane PLN designated by the address signal. These command, address signal, and data are introduced to the input buffer 122 of the NAND flash memory 100 whenever the write enable signal WEn is toggled.

Subsequently, at time between t11 and t12, the NAND flash memory 100 stores the data in the first cache 116 in response to the command "TC2", and transfers the data to the second cache 117 or the third cache 118 corresponding to the address signal. More specifically, within the NAND flash memory 100, the address buffer 125 transmits a signal PLN0_PG2, a signal PLN1_PG2, a signal DoPLN0, and a signal DoPLN1 to the sense unit 113 via the memory cell control register 130 in response to the address signal. The signal PLN0_PG2 and the signal PLN1_PG2 are set to be at an "H" level when the address signal indicates the second page of the plane PLN0 or the plane PLN1. The signal DoPLN0 and the signal DoPLN1 are the signals indicating the selected plane PLN. When the plane PLN0 is selected, the signal DoPLN0 is set to be at an "H" level, and when the plane PLN1 is selected, the signal DoPLN1 is set to be at an "H" level. The command decoder 126 transmits the signal CMD_TC2 to the sense unit 113 via the memory cell control register 130 in response to the command "TC2". When the command "TC2" is received from the controller 200, the signal CMD_TC2 is set to be at an "H" level. Thus, when the command "TC2" is received, the NAND flash memory 100 sets the signal CMD_TC2 to be at an "H" level. In the sense unit 113, the data of the first cache 116 of the plane PLN designated by the signal DoPLN0 and the signal DoPLN1 are transferred to the second cache 117 or the third cache 118 designated by the signal PLN0_PG2 and the signal PLN1_PG2 in response to the signal CMD_TC2 (the level "H).

In the meantime, the NAND flash memory 100 is in the busy state, and the state machine 129 sets the ready/busy signal RBn indicating the busy state to be at an "L" level and transmits the ready/busy signal to the controller 200. Hereinafter, a period of the busy state corresponding to the command "TC2" is referred to as tBUSY1.

If the transmission of the data to the second cache 117 or the third cache 118 is completed, the NAND flash memory 100 turns into the ready state, and the state machine 129 returns the ready/busy signal RB to be at an "H" level.

1.3.2 Multi-plane Program

Figure 6:
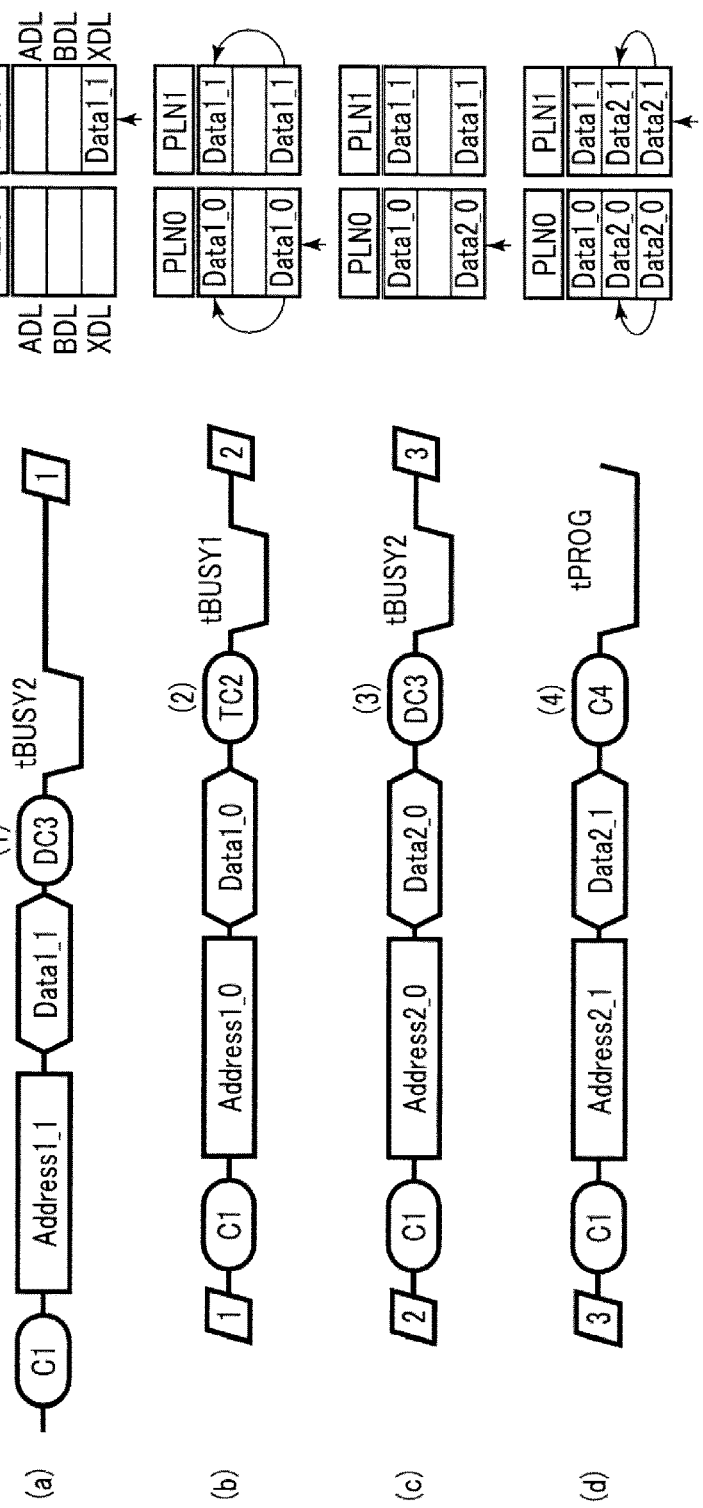
FIG. 6 illustrates a sequence of commands and data transmitted during a data writing operation and a stored state of data in a sense unit of the semiconductor memory device according to the first embodiment.

Hereinafter, the multi-plane program will be described by especially focusing on the data storing states of the first to third caches 116 to 118 with reference to FIGS. 6 and 7. In FIG. 6, only the input and output signal IO<7:0> (the command, the address signal or the data) is illustrated as the signal transmitted from the controller 200.

FIG. 7 shows a logic state of the control signal transmitted to the sense unit 113 from the address buffer 125 and the command decoder 126 via the memory cell control register 130 at the time of receiving the write data four times in FIG. 6.

As shown in FIG. 6, the controller 200 transmits the command "C1", an address signal "Address1-1" indicating the first page of the plane PLN1, first data "Data1_1" of the plane PLN1, and a command "DC3" when a first data transmission is carried out (reference numeral (a) of FIG. 6). The command "DC3" is a command for commanding the NAND flash memory to write the data into the first cache 116 of the selected plane PLN (without transferring data to the second cache 117 or the third cache 118). If the command "DC3" is received, the NAND flash memory 100 stores the data in the first cache 116 corresponding to the plane PLN designated by the previously received address signal. The address signal includes information indicating the first page or the second page, but the NAND flash memory 100 suspends transmitting the data to the second cache 117 or the third cache 118 when the command "DC3" is received.

As shown in FIG. 7, in the NAND flash memory 100, since the suspend state is maintained after the data are received (reference numeral (1) of FIGS. 6 and 7), the signal DoPLN1 is set to be at an "H" level so as to correspond to the address signal "Address1_1". The signal DoPLN1 is maintained at an "H" level until the data are transmitted to the second cache 117. Specifically, for example, an "H" level is maintained in the memory cell control register 130. On the other hand, the signal DoPLN0, the signal PLN0_PG2, the signal PLN1_PG2, and the signal CMD_TC2 are set to be at an "L" level.

As a result, the sense unit 113 stores the first data "Data1_1" in the first cache 116_1 of the plane PLN1. Hereinafter, a period of the busy state corresponding to the command "DC3" is referred to as tBUSY2. If the period tBUSY1 and the period tBUSY2 are compared, since there is no data transmission, a processing time is shorter in the period tBUSY2. Since the period tBUSY2 is a short time, the operation of setting the ready/busy signal RBn to be at an "L" level may be omitted.

Thereafter, when a second data transmission is carried out (reference numeral (b) of FIG. 6), the controller 200 transmits the command "C1", an address signal "Address1_0" indicating the first page of the plane PLN0, first data "Data1_0" of the plane PLN0, and a command "TC2".

After the data are received (reference numeral (2) of FIGS. 6 and 7), the signal DoPLN0 is set to be at an "H" level so as to correspond to the address signal "Address1_0", and the signal CMD_TC2 is set to be at an "H" level so as to correspond to the command "TC2". The signal DoPLN1 is maintained at an "H" level from the first data reception.

In the sense unit 113, the first data "Data1_0" are initially stored in the first cache 116_0 of the plane PLN0. Since the signal DoPLN0 and the signal DoPLN1 are set to be at an "H" level and the signal PLN0_PG2 and the signal PLN1_PG2 are set to be at an "L" level, the sense unit 113 respectively transmits the data "Data1_0" of the first cache 116_0 and the data "Data1_1" of the first cache 116_1 to the second caches 117_0 and 117_1 in response to an "H" level of the signal CMD_TC2.

Subsequently, when a third data transmission is carried out (reference numeral (c) of FIG. 6), the controller 200 transmits the command "C1", an address signal "Address2_0" indicating the second page of the plane PLN0, second data "Data2_0" of the plane PLN0, and the command "DC3".

After the data are received (reference numeral (3) of FIGS. 6 and 7), the signal DoPLN0 and the signal PLN0_PG2 are set to be at an "H" level so as to correspond to the address signal "Address2_0", and the data are maintained in this state until the data are transmitted to the third cache 118_0.

The sense unit 113 stores the second data "Data2_0" in the first cache 116_0 of the plane PLN0.

Thereafter, when fourth data transmission is carried out (reference numeral (d) of FIG. 6), the controller 200 transmits the command "C1", an address signal "Address2_1" indicating the second page of the plane PLN1, second data "Data2_1" of the plane PLN1, and a command "C4". The command "C4" is a command for writing data in the first cache 116, transferring data in the first cache 116 to the second cache 117 or the third cache 118, and commanding the NAND flash memory to write the data in the memory cell array 111.

After the data are received (reference numeral (4) of FIGS. 6 and 7), the signal DoPLN1 and the signal PLN1_PG2 are set to be at an "H" level so as to correspond to the address signal "Address2_1".

Initially, the sense unit 113 stores the second data "Data2_1" in the first cache 116_1 of the plane PLN1. Subsequently, since the signal DoPLN0, the signal DoPLN1, the signal PLN0_PG2, and the signal PLN1_PG2 are set to be at an "H" level, the sense unit 113 transmits the data "Data2_0" of the first cache 116_0 and the data "Data2_1" of the first cache 116_1 to the third caches 118_0 and 118_1, respectively. Thereafter, the NAND flash memory 100 writes the data in the second cache 117 and the third cache 118 in the memory cell array 111 through the full sequence. Hereinafter, a period of the busy state corresponding to the command "C4" is referred to as tPROG. Since the write operation on the memory cell array 111 is included, the processing time of the period tPROG is longer than that of the period tBUSY1. Thus, when the period tPROG, the period tBUSY1 and period tBUSY2 are compared, the relationship of tPROG>tBUSY1>tBUSY2 is satisfied.

Although the controller 200 transmits the data in order of the first page of the plane PLN1, the first page of the plane PLN0, the second page of the plane PLN0, the second page of the plane PLN1 in this embodiment, the transmission order may be arbitrarily changed.

Although in the transmission of the first data and the third data that the controller 200 transmits the command "DC3" and does not transmit the data to the second cache 117 or the third cache 118, the controller may transmit the command "TC2" and may transmit the data.

1.4 Advantage of Present Embodiment

In the configuration according to the present embodiment, a processing capability can be improved. Hereinafter, the advantage of the present embodiment will be described.

When the write operation is performed in the full sequence, if the order of data transmission from the controller 200 to the NAND flash memory 100 is fixed, it is necessary for the controller 200 to store the data received from the host device therein and transmit the stored data to the NAND flash memory 100 in accordance with the order of data transmission. Thus, the controller 200 tends to need a longer time until the transmission of data is started after the data are received as the number of pages is increased. For example, when the number of planes is increased in the multi-plane program, or when the number of bits that can be stored in the memory cell transistor MT is increased, since the number of pages is increased, a start time tends to be long. The controller 200 needs to secure a memory region within the controller 200 such that data of all pages to be written can be stored.

In contrast, according to the present embodiment, the controller 200 may arbitrarily determine the data transmission order. The NAND flash memory 100 can transmit the data to the second and third caches 117 and 118 in response to the command from the controller 200. Thus, for example, the controller 200 can transmit the data received from the host device to the NAND flash memory 100 in the reception order. Thus, since it is possible to reduce the time until the transmission is started after the data are received, the controller 200 can improve the processing performance.

According to the present embodiment, it is possible to arbitrarily determine a timing when the controller 200 transfers the data to the second cache 117 or the third cache 118 from the first cache 116. Accordingly, for example, it is possible to reduce the processing time by optimizing the data transfer order and the data transfer timing between the caches. Therefore, it is possible to improve the processing capability. Specifically, it is possible to further reduce the processing time than in the case where the data are separately transmitted by storing the data in both the first cache 116_0 of the plane PLN0 and the first cache 116_1 of the plane PLN1 and then transmitting the data collectively.

According to the present embodiment, the controller 200 can transmit the data to the NAND flash memory 100 in the reception order. Thus, within the controller 200, since it is not necessary to secure the memory region such that the data of all pages to be written can be stored, it is possible to reduce the memory region. Accordingly, it is possible to reduce a circuit area of the controller 200.

According to the present embodiment, since the semiconductor memory device can store the data within the sense unit 113 in an arbitrary order, it is possible to improve convenience by facilitating the handling of the data. Thus, it is possible to improve a processing efficiency of the entire memory system.

2. Second Embodiment

Hereinafter, a semiconductor memory device and a memory system according to a second embodiment will be described. The present embodiment shows a case where the data are stored by performing an overwrite operation or an OR operation of the data on the data already stored in the cache when the data are transferred to the second cache 117 or the third cache 118 from the first cache 116 in the first embodiment. Only a difference from the first embodiment will be described below.

2.1 Entire Configuration of Memory System

The configuration of a memory system according to the present embodiment will be described. A difference from the first embodiment is that a command "TC5" is transmitted to the NAND flash memory 100 from the controller 200, and a signal CMD_TC5 is transmitted to the sense unit 113 from the command decoder 126 via the memory cell control register 130 so as to correspond to the command "TC5". The command "TC5" is a command for performing an OR operation on the data previously stored in the second cache 117 or the third cache 118 and the data stored in the first cache when the data stored in the first cache 116 are transferred to the second cache 117 or the third cache 118. The signal CMD_TC5 is set to be at an "H" level when the command "TC5" is received from the controller 200.

2.2 Write Operation

The write operation in the present embodiment will be described with reference to FIGS. 8 and 9. In the present embodiment, the multi-plane is used as an example, and the OR operation of first data of the first page and second data of the first page is performed in the plane PLN0 and the first data of the first page, and the second data of the first page are overwritten in the plane PLN1.

Figure 8:
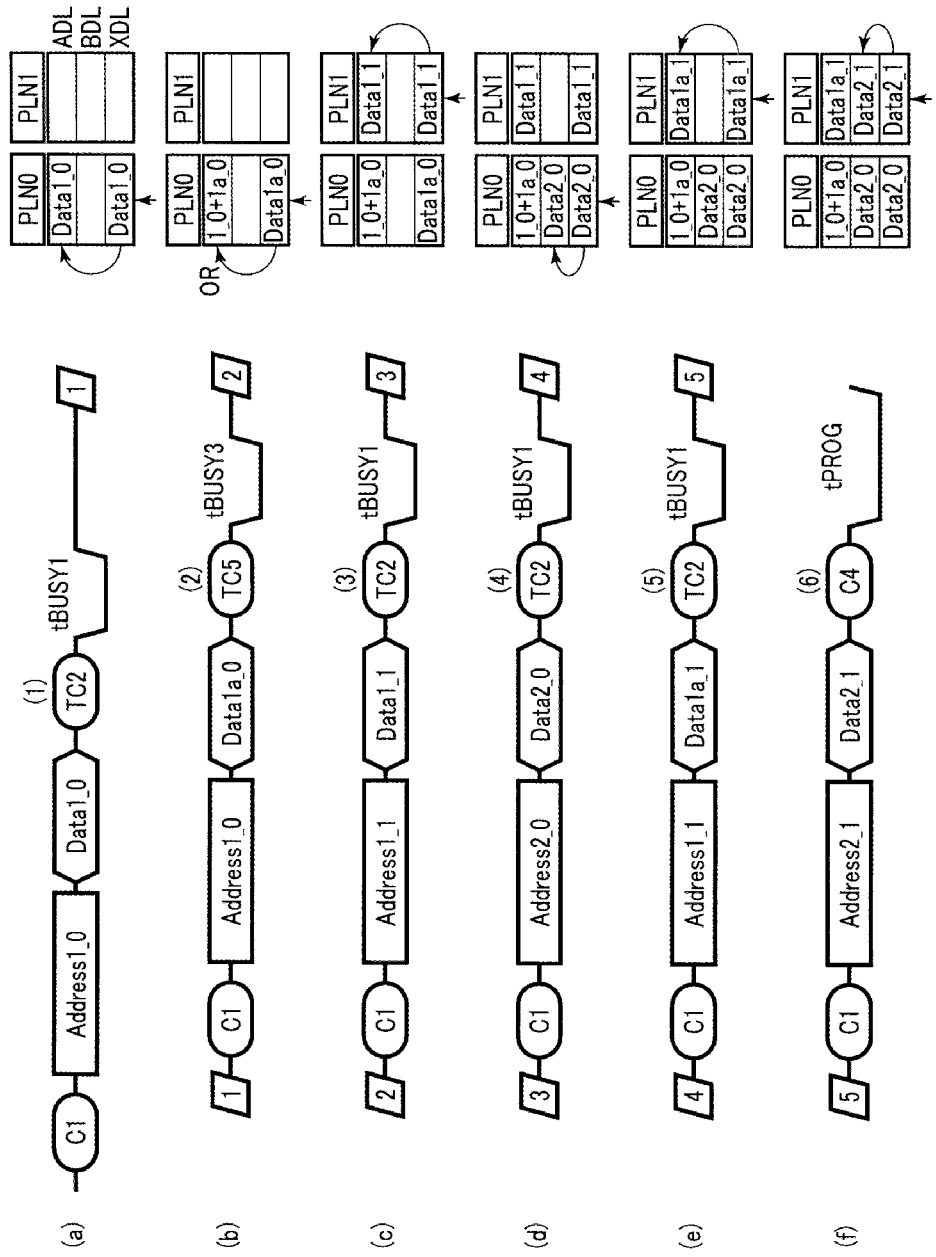
FIG. 8 illustrates a sequence of commands and data transmitted during a data writing operation a stored state of data in a sense unit of a semiconductor memory device according to a second embodiment.

As shown in FIG. 8, initially, when a first data transmission is carried out (reference numeral (a) of FIG. 8), the controller 200 transmits a command "C1", an address signal "Address1_0", first data "Data1_0" of the plane PLN0, and a command "TC2".

After a first data reception is performed (reference numeral (1) of FIGS. 8 and 9), a signal DoPLN0 is set to be at an "H" level so as to correspond to the address signal "Address1_0". A signal CMD_TC2 is set to be at an "H" level so as to correspond to the command "TC2".

The sense unit 113 stores the first data "Data1_0" in the first cache 116_0. Since the signal DoPLN0 is set to be at an "H" level and the signal PLN0_PG2 is set to be at an "L" level, the sense unit 113 transmits the data "Data1_0" of the first cache 116_0" to the second cache 117_0 in response to the signal CMD_TC2.

Subsequently, when a second data transmission is carried out (reference numeral (b) of FIG. 8), the controller 200 transmits a command "C1", an address signal "Address1_0", first data "Data1a_0" of the plane 0, and a command "TC5". Hereinafter, a period of a busy state corresponding to the command "TC5" is referred to as tBUSY3. When compared with the period tBUSY1, a processing time is equal to or longer than that at the period tBUSY1 due to the OR operation.

After a second data reception is performed (reference numeral (2) of FIGS. 8 and 9), the signal DoPLN0 is set to be at an "H" level so as to correspond to the address signal "Address1_0", and the signal CMD_TC5 is set to be at an "H" level so as to correspond to the command "TC5".

Initially, the sense unit 113 stores the first data "Data1a_0" in the first cache 116_0. Since the signal DoPLN0 is set to be at an "H" level and the signal PLN0_PG2 is set to be at an "L" level, the sense unit 113 performs the OR operation of the data "Data1a_0" of the first cache 116_0 and the data "Data1_0" of the second cache 117_0 in response to the signal CMD_TC5, and stores the operation result ("1_0+1a_0") in the second cache 117_0.

For example, it is assumed that the data "Data1_0" has an arbitrary value of "1" or "0" from an address 0 to an address 127 and has a value of "0" in addresses subsequent to the address 128. It is assumed that the data "Data1a_0" has a value of "0" from an address 0 to an address 127, and has an arbitrary value of "1" or "0" in addresses subsequent to the address 128. In such a case, the sense unit 113 performs the OR operation of the data "Data1_0" and the data "Data1a_0" by the command from the controller 200, and configures the data "1_0+1a_0" of one page.

Thereafter, when a third data transmission is carried out (reference numeral (c) of FIG. 8), the controller 200 transmits a command "C1", an address signal "Address1_1", first data "Data1_1" of the plane PLN1, and a command "TC2".

After a third data reception is performed (reference numeral (3) of FIGS. 8 and 9), the signal DoPLN1 is set to be at an "H" level so as to correspond to the address signal "Address1_1". The signal CMD_TC2 is set to be at an "H" level so as to correspond to the command "TC2".

The sense unit 113 stores the first data "Data1_1" in the first cache 116_1". Since the signal DoPLN1 is set to be at an "H" level and the signal PLN1_PG2 is set to be at an "L" level, the sense unit 113 transmits the data "Data1_1" of the first cache 116_1" to the second cache 117_1 in response to the signal CMD_TC2.

Thereafter, when a fourth data transmission is carried out (reference numeral (d) of FIG. 8), the controller 200 transmits a command "C1", an address signal "Address2_0", second data "Data2_0" of the plane PLN0, and a command "TC2".

After a fourth data reception is performed (reference numeral (4) of FIGS. 8 and 9), the signal DoPLN0 and the signal PLN0_PG2 are set to be at an "H" level so as to correspond to the address signal "Address2_0". The signal CMD_TC2 is set to be at an "H" level so as to correspond to the command "TC2".

The sense unit 113 stores second data "Data2_0" in the first cache 116_0. Since the signal DoPLN0 is set to be at an "H" level and the signal PLN0_PG2 is set to be at an "H" level, the sense unit 113 transmits the data "Data2_0" of the first cache 116_0 to the third cache 118_0 in response to the signal CMD_TC2.

Subsequently, when a fifth data transmission is carried out (reference numeral (e) of FIG. 8), the controller 200 transmits a command "C1", an address signal "Address1_1", first data "Data1a_1" of the plane PLN1, and a command "TC2".

After a fifth data reception is performed (reference numeral (5) of FIGS. 8 and 9), the signal DoPLN1 is set to be at an "H" level so as to correspond to the address signal "Address1_1". The signal CMD_TC2 is set to be at an "H" level so as to correspond to the command "TC2".

The sense unit 113 stores the first data "Data1a_1" in the first cache 116_1. Since the signal DoPLN1 is set to be at an "H" level and the signal PLN1_PG2 is set to be at an "L" level, the sense unit 113 transmits (overwrites) the data "Data1a_1" of the first cache 116_1 to the second cache 117_1 in response to the signal CMD_TC2.

Subsequently, when a sixth data transmission is carried out (reference numeral (f) of FIG. 8), the controller 200 transmits a command "C1", an address signal "Address2_1", second data "Data2_1" of the plane PLN1, and a command "C4".

After a sixth data reception is performed (reference numeral (6) of FIGS. 8 and 9), the signal DoPLN1 and the signal PLN1_PG2 are set to be at an "H" level so as to correspond to the address signal "Address2_1".

Initially, the sense unit 113 stores the second data "Data2_1" in the first cache 116_1 of the plane PLN1. Since the signal DoPLN1 and the signal PLN1_PG2 are set to at an "H" level, the sense unit 113 transmits the data "Data2_1" of the first cache 116_1 to the third cache 118_1. Thereafter, the NAND flash memory 100 writes the data stored in the second cache 117 and the third cache 118 in the memory cell array 111 in the full sequence. psl 2.3 Advantage of Present Embodiment According to the present embodiment, it is possible to improve the processing performance as in the first embodiment.

According to the present embodiment, when the data are transmitted from the first cache 116 to the second cache 117 or the third cache 118, it is possible to carry out the OR operation of the data previously stored in the second cache 117 or the third cache 118 and the transmitted data. Thus, it is possible to further improve the processing capability. The advantage of the present embodiment will be described below in detail.

For example, when addition data (updated data) are generated in the data already stored in the second cache 117 and the OR operation is performed within the controller 200, it is necessary for the controller 200 to read already input data previously stored in the second cache 117 into the controller 200, perform the OR operation of the addition data and input data, and transmit the data to the NAND flash memory 100 again. More specifically, it is necessary to perform procedures of (1) transmitting the already input data to the first cache 116 from the second cache 117, (2) transmitting the already input data to the controller 200 from the NAND flash memory 100, (3) performing the OR operation of the already input data and the addition data within the controller 200, (4) transmitting the data in which the operation is performed to the NAND flash memory 100 from the controller 200, and (5) transmitting the data to the second cache 117 from the first cache.

In contrast, according to the present embodiment, when the addition data are transmitted from the first cache 116 to the second cache 117, it is possible to perform the same operations as the above-described procedures (1) to (5) by performing the OR operation. Thus, the processing time can be reduced when it is necessary to perform the OR operation, and thus, it is possible to improve the processing efficiency.

According to the present embodiment, the OR operation of the data within the sense unit 113 can be performed, and thus, it is possible to transmit data of one page multiple times. For example, the controller 200 can divide data having a data length of 16K bytes of one page into 4K-byte data units, and can transmit 4K-byte data four times. Thus, it is possible to further increase a data length per one page of the NAND flash memory 100 than the data length that can be transmitted to the NAND flash memory 100 from the controller 200 once. Accordingly, it is possible to increase a storage capacity of the NAND flash memory 100 irrespective of the amount of data capable of being transmitted from the controller 200.

According to the present embodiment, it is possible to carry out an overwrite process of data on the second cache 117 or the third cache 118 that already stores data. Thus, it is possible to further improve the processing efficiency. The advantage of the present embodiment will be described below in detail.

For example, it is assumed that when the write operation is performed in the full sequence, the data transmission order to the NAND flash memory 100 from the controller 200 is fixed. In such a case, for example, when it is necessary to overwrite the data stored in the second cache 117, it is necessary for the controller 200 to read all data stored in the sense unit 113 into the controller 200, overwrite the data, and retransmit the data from the beginning.

In contrast, according to the present embodiment, since the data transmission order from the controller 200 to the NAND flash memory 100 is flexible, it is possible to overwrite separate data in, for example, the second cache 117 that already stores the data. Thus, since it is not necessary to read the data stored within the sense unit 113 into the controller 200 again and it is not necessary to retransmit the data from the first, it is possible to reduce the processing time when it is necessary to overwrite the data, and, thus, it is possible to improve the processing capability.

Although the OR operation is performed in the present embodiment, other logical operations such as a logic product (AND) operation, a negative logical product (NAND) operation, and an exclusive OR (XOR) operation may be performed. In this case, other commands and signals different from the command "TC5" and the signal CMD_TC5 may be added.

3. Third Embodiment

Hereinafter, a semiconductor memory device and a memory system according to a third embodiment will be described. The present embodiment corresponds to a case where there are no data of the first or second page when the multi-plane program is executed in the first and second embodiments. Only a difference from the first embodiment will be described below.

3.1 Entire Configuration of Memory System

The configuration of a memory system according to the present embodiment will be described. A difference from the first embodiment is that a command "TC9" transmitted to the NAND flash memory 100 from the controller 200 and a signal CMD_TC9 transmitted to the sense unit 113 from the command decoder 126 via the memory cell control register 130 so as to correspond to the command "TC9" are added. The command "TC9" is a command for initializing (setting all data to be "1") data of the first cache 116 of a non-selected plane PLN and transmitting the data. When the command "TC9" is received from the controller 200, the signal CMD_TC9 is set to be at an "H" level.

3.2 Write Operation

A write operation according to the present embodiment will be described with reference to FIGS. 10 and 11. In the present embodiment, the multi-plane program is used as an example, and there are no data of the first page of the plane PNL1.

Figure 10:
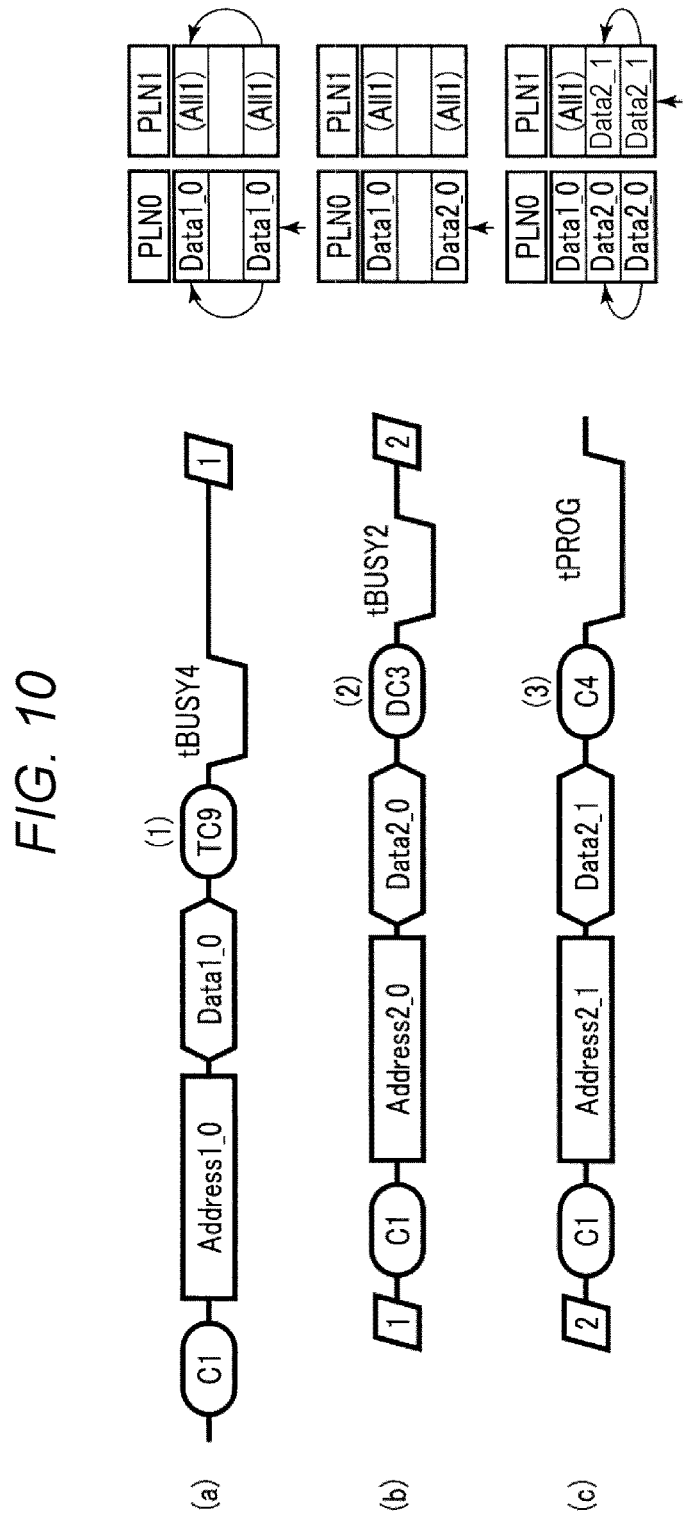
FIG. 10 illustrates a sequence of commands and data transmitted during a data writing operation and a stored state of data in a sense unit of the semiconductor memory device according to a third embodiment.

As shown in FIG. 10, initially, when a first data transmission is carried out (reference numeral (a) of FIG. 10), the controller 200 transmits a command "C1", an address signal "Address1_0", data "Data1_0", and a command "TC9".

In the NAND flash memory 100, after the data are received (reference numeral (1) of FIGS. 10 and 11), a signal DoPLN0 is set to be at an "H" level so as to correspond to the address signal "Address1_0". A signal CMD_TC9 is set to be at an "H" level so as to correspond to the command "TC9".

The sense unit 113 stores data "Data1_0" in the first cache 116_0 of the plane PLN0, and then transmits the data to the second cache 117_0. The sense unit 113 initializes the first cache 116_1 (ALL "1") in response to the signal CMD_TC9, and transmits initialization data (ALL "1") to the second cache 117_1. Hereinafter, a period of a busy state corresponding to the command "TC9" is referred to as tBUSY4. Since the input or initialized data is transmitted to the first cache, the period tBUSY4 has the substantially same processing time as that of the period tBUSY1.

Subsequently, after a second data reception is performed (reference numeral (2) of FIGS. 10 and 11), the sense unit 113 stores second data "Data2_0" in the first cache 116_0.

Subsequently, when a third data transmission is carried out (reference numeral (c) of FIG. 10), the controller 200 transmits a command "C1", an address signal "Address2_1", data "Data2_1", and a command "C4".

After a third data reception is performed (reference numeral (3) of FIGS. 10 and 11), a signal DoPLN1 and a signal PLN1_PG2 are set to be at an "H" level so as to correspond to the address signal "Address2_1". The signal DoPLN0 and the signal PLN0_PG2 are maintained at a state in which the second data is received to be at an "H" level.

Initially, the sense unit 113 stores the data "Data2_1" in the first cache 116_1". Subsequently, the sense unit 113 transmits the data "Data2_0" and the data "Data2_1" stored in the first cache 116_0 and the first cache 116_1 to the third cache 118_0 and 118_1. Thereafter, the NAND flash memory 100 writes the data in the second cache 117 and the third cache 118 in the memory cell array 111.

Although the first cache 116 is initialized and transmitted in the non-selected plane PLN in response to the command TC9 in the above description, all the first to third caches 116 to 118 may be initialized before the initial write data is received. In this case, since it is not necessary to perform the process of transmitting the initialized data in the non-selected plane PLN, the command "TC9" may be omitted. Although the first cache of the non-selected plane PLN is initialized in the above description, the plane PLN for initializing the first cache may be selected by the command from the controller 200.

3.3 Advantage of Present Embodiment

According to the present embodiment, it is possible to improve the processing capability as in the first embodiment.

According to the present embodiment, it is possible to perform the write operation even when a page having no data is included. Thus, it is possible to improve the processing capability. Hereinafter, the advantage of the present embodiment will be described in detail.

For example, it is assumed that when the write operation is performed in the full sequence, the data transmission order from the controller 200 to the NAND flash memory 100 is fixed. In such a case, if there is a page having no data, since it is difficult to transmit data in the transmission order, it is difficult to perform the writing. In contrast, for example, there is a method of generating dummy data in the page having no data within the controller 200 and transmitting the data to the NAND flash memory 100. When the dummy data are generated, since it is necessary to transmit the dummy data from the controller 200 to the NAND flash memory 100, the number of times data are transmitted from the controller 200 to the NAND flash memory 100 increases, and thus, the processing time becomes longer.

In contrast, according to the present embodiment, it is possible to input the data (ALL "1") of the initialized first cache 116 to the page having no data. Since the order of transmitting the data from the controller 200 is flexible, it is possible to omit the transmission of the dummy data from the controller 200 to the NAND flash memory. Thus, it is possible to reduce the processing time, and thus, it is possible to improve the processing capability.

4. Fourth Embodiment

Hereinafter, a semiconductor memory device and a memory system according to a fourth embodiment will be described. The present embodiment corresponds to a case where the data of the second cache 117 and the third cache 118 are swapped in the first to third embodiments. Only a different from the first embodiment will be described below.

4.1 Entire Configuration of Memory System

The configuration of a memory system according to the present embodiment will be described. A difference from the first embodiment is that a command "TC7" is transmitted to the NAND flash memory 100 from the controller 200 and a signal CMD_TC7 is transmitted to the sense unit 113 from the command decoder 126 via the memory cell control register 130 so as to correspond to the command "TC7". The command "TC7" is a command for swapping the data between the second cache 117 and the third cache 118. The signal CMD_TC7 is set to be at an "H" level when the command "TC7" is received from the controller 200.

4.2 Write Operation

A write operation according to the present embodiment will be described with reference to FIGS. 12 and 13. In the present embodiment, the data in the second cache 117_0 and the data in the third cache 118_0 are swapped when the full sequence is performed in the plane PLN0.

Figure 12:
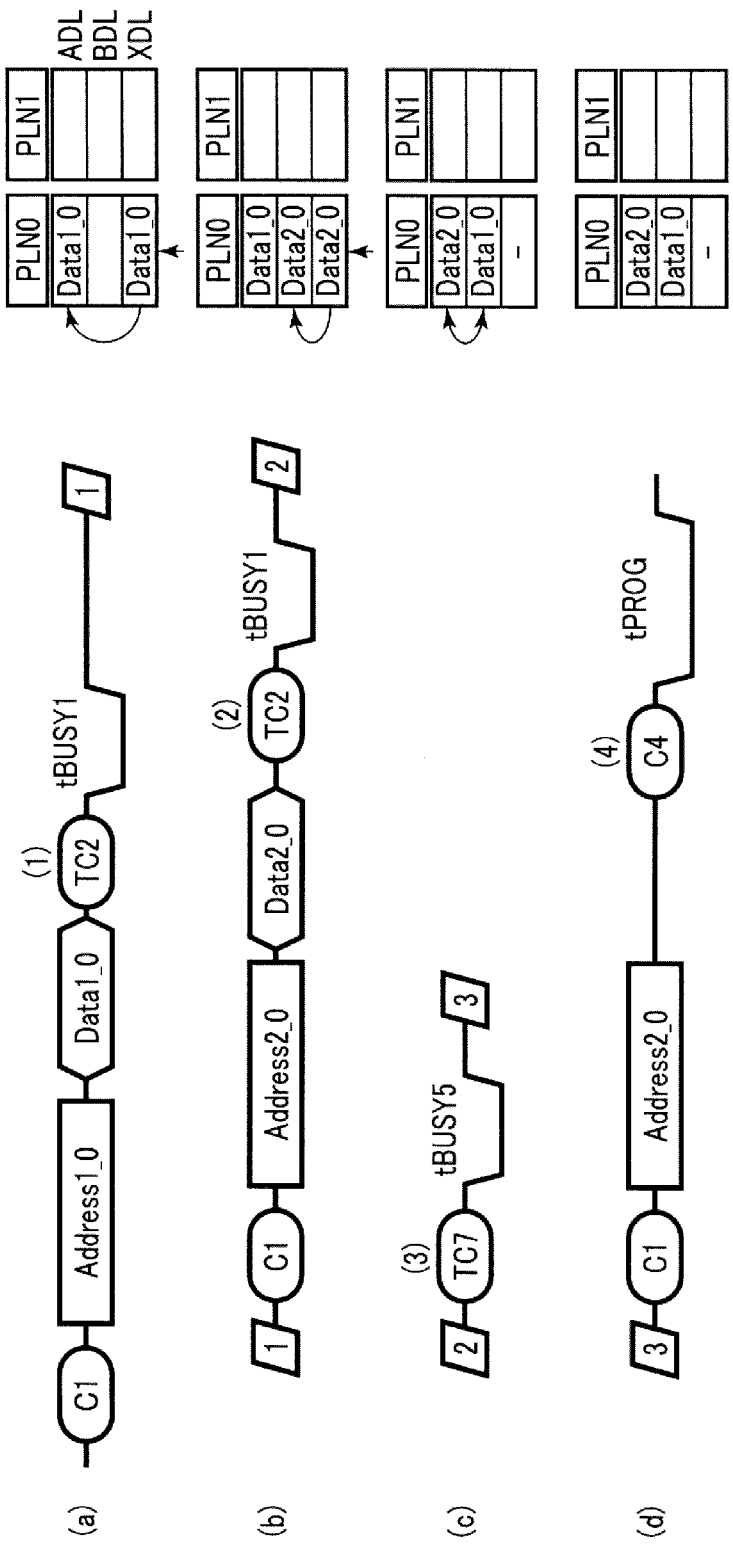
FIG. 12 illustrates a sequence of commands and data transmitted during a data writing operation a stored state of data in a sense unit of a semiconductor memory device according to a fourth embodiment.

As shown in FIG. 12, after a first data reception is performed initially (reference numeral (1) of FIGS. 12 and 13), the sense unit 113 stores data "Data1_0" in the second cache 117_0.

Hereinafter, after a second data reception is performed (reference numeral (2) of FIGS. 12 and 13), the sense unit 113 stores data "Data2_0" in the third cache 118_0.

Subsequently, when a third data transmission is carried out (reference numeral (c) of FIG. 12), the controller 200 transmits a command "TC7".

After a third data reception is performed (reference numeral (3) of FIGS. 12 and 13), a signal DoPLN0 corresponding to the plane PLN0 is set to be at an "H" level. A signal CMD_TC7 is set to be at an "H" level so as to correspond to the command "TC7".

The sense unit 113 swaps the data "Data1_0" and the data "Data2_0" stored in the second cache 117_0 and the third cache 118_0, respectively. Specifically, for example, after the data "Data1_0" stored in the second cache 117_0 are transferred to the first cache 116_0, the sense unit 113 transfers the data "Data2_0" stored in the third cache 118_0 to the second cache 117_0. Thereafter, the sense unit 113 transfers the data "Data1_0" stored in the first cache 116_0 to the second cache 117_0. As the swapping procedure is not limited, the data initially stored in the third cache 118 may be transferred to the first cache 116, and the swapping procedure is not limited. The NAND flash memory 100 may arbitrarily swap the data already stored in the caches for a period during which the data are input or for a period until the writing is actually performed in the memory cell array 111 is started after the input is completed. Hereinafter, a period of a busy state corresponding to the command "TC7" is referred to as tBUSY5. Since it is necessary to transmit data multiple times in the first to third caches 116 to 118, the processing time at the period tBUSY5 becomes longer than that at the period tBUSY1.

Subsequently, when a fourth data transmission is carried out (reference numeral (d) of FIG. 12), the controller 200 transmits a command "C1", an address "Address2_0", and a command "C4". Since the data are already stored in the second cache 117_0 and the third cache 118_0, the data are not transmitted from the controller 200 to the NAND flash memory 100.

After a fourth data reception is performed (reference numeral (4) of FIGS. 12 and 13), since the data are not received, a signal DoPLN0 is set to be at an "L" level irrespective of the address signal "Address2_0".

The NAND flash memory 100 writes the data "Data2_0" stored in the second cache 117_0, as the first page, and writes the data "Data1_0" stored in the third cache 118_0, as the second page, into the memory cell array 111_0.

Although the data of the second cache 117 and the third cache 118 are swapped in response to the command "TC7" in the present embodiment, the functions of the second cache 117 and the third cache 118 may be swapped. That is, in response to the command "TC7", the second cache 117 may function as a cache that stores the data of the second page, and the third cache 118 may function as a cache that stores the data of the first page. In this case, it is not necessary to swap the data.

Although an address signal "Address2_0" is transmitted when the fourth data transmission is carried out, the address signal "Address2-1 may be transmitted, or a signal including address information of the memory cell array 111_0 may be transmitted.

4.3 Advantage of Present Embodiment

According to the present embodiment, it is possible to improve the processing capability as in the first embodiment.

According to the present embodiment, it is possible to swap the data in the second cache 117 and data in the third cache. Thus, it is possible to further improve the processing capability. Hereinafter, the advantage of the present embodiment will be described in detail.

For example, it is assumed that when the write operation is performed in the full sequence, the data transmission order from the controller 200 to the NAND flash memory 100 is fixed. In such a case, if the pages (the first page and the second page) in which the data are written are to be swapped, it is necessary for the controller 200 to retransmit the data in response to the data transmission order by reading the data in the second cache 117 and the data in the third cache into the controller 200.

By contrast, according to the present embodiment, since the order of transmitting the data to the NAND flash memory 100 from the controller 200 is flexible, it is possible to swap the write pages by merely swapping the data in the second cache 117 and the data in the third cache 118. Thus, since it is not necessary to retransmit the data after the controller 200 reads back the data, it is possible to reduce the processing time, and thus, it is possible to improve the processing efficiency.

According to the present embodiment, it is possible to improve the reliability of the data. For example, when the second page has a write error rate higher than that of the first page in the memory cell array 111, the controller 200 swaps the data written in the first page and the second page, and writes more important data in the first page having a lower error rate. As a result, it is possible to improve the reliability of the data.

5. Fifth Embodiment

Hereinafter, a semiconductor memory device and a memory system according to a fifth embodiment will be described. The present embodiment corresponds to a case where the orders of inputting the data in the second cache 117 and the third cache 118 are swapped from the orders in the first to fourth embodiments. Only a difference from the first embodiment will be described below.

5.1 Write Operation

A write operation according to the present embodiment will be described with reference to FIGS. 14 and 15. In the present embodiment, when the full sequence is performed in the plane PLN0, the data are stored in the second cache 117_0 after the data are stored in the third cache 118_0.

Figure 14:
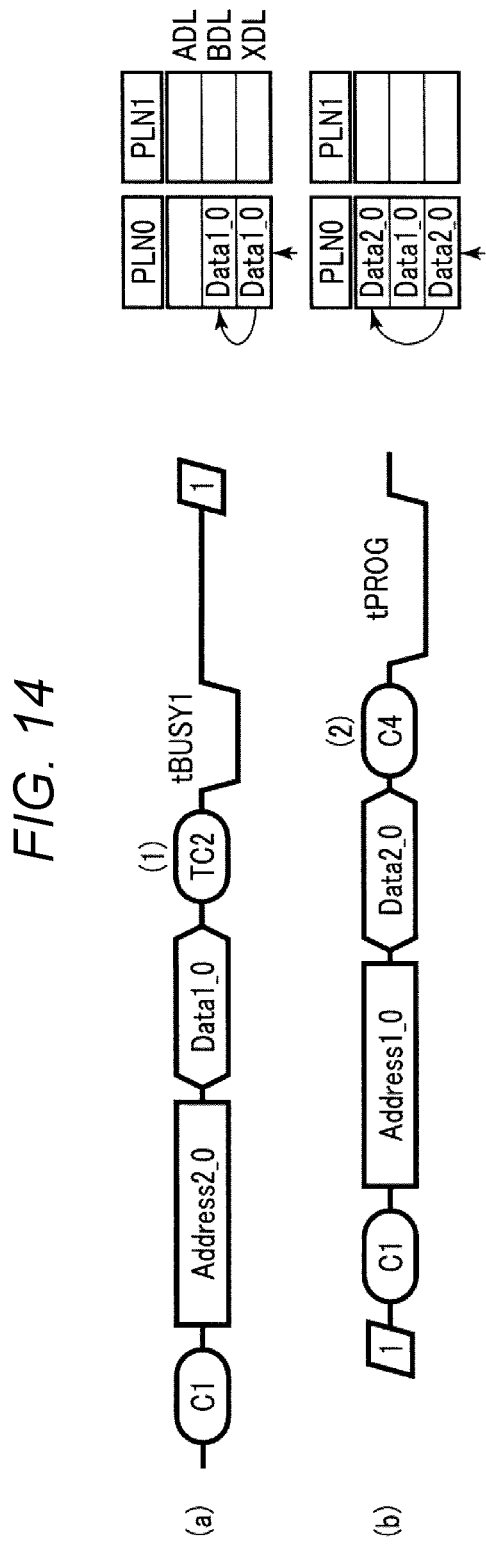
FIG. 14 illustrates a sequence of commands and data transmitted during a data writing operation and a stored state of data in a sense unit of a semiconductor memory device according to a fifth embodiment.

As shown in FIG. 14, after a first data reception is performed (reference numeral (1) of FIGS. 14 and 15), the sense unit 113 stores first data "Data1_0" in the third cache 118_0.

Subsequently, after a second data transmission is carried out (reference numeral (b) of FIG. 14), the controller 200 transmits a command "C1", an address signal "Address1_0", second data "Data2_0" of the plane PLN0, and a command "C4".

After a second data reception is performed (reference numeral (2) of FIGS. 14 and 15), the sense unit 113 stores the second data "Data2_0" in the first cache 116_0 of the plane PLN0, and then transmits the data to the second cache 117_0. Thereafter, the NAND flash memory 100 writes the data "Data2_0" stored in the second cache 117_0 in the first page of the memory cell transistor MT, which is a target of the plane PLN0, and writes the data "Data1_0" stored in the third cache 118_0 thereof in the second page.

5.2 Advantage of Present Embodiment

According to the present embodiment, it is possible to improve the processing capability similarly to the first embodiment.

6. Sixth Embodiment

Hereinafter, a semiconductor memory device and a memory system according to a sixth embodiment will be described. The present embodiment corresponds to a case where the controller 200 reads data stored in the second cache 117 or the third cache 118 in the first to fifth embodiments. Only a difference from the first embodiment will be described below.

6.1 Entire Configuration of Memory System

The configuration of a memory system according to the present embodiment will be described. A difference from the first embodiment is that a command "TC8" is transmitted to the NAND flash memory 100 from the controller 200, and a signal CMD_TC8 is transmitted to the sense unit 113 from the command decoder 126 via the memory cell control register 130 so as to correspond to the command "TC8". The command "TC8" is a command for causing the NAND flash memory to transmit the data to the first cache 116 while storing the data in the second cache 117 or the third cache 118 and allowing the controller 200 to read the data in the first cache 116. The signal CMD_TC8 is set to be at an "H" level when the command "TC8" is received from the controller 200.

6.2 Write Operation

A write operation according to the present embodiment will be described with reference to FIGS. 16 and 17. In the present embodiment, the controller 200 reads the data of the second cache 117_0 when the full sequence is performed in the plane PLN0.

Figure 16:
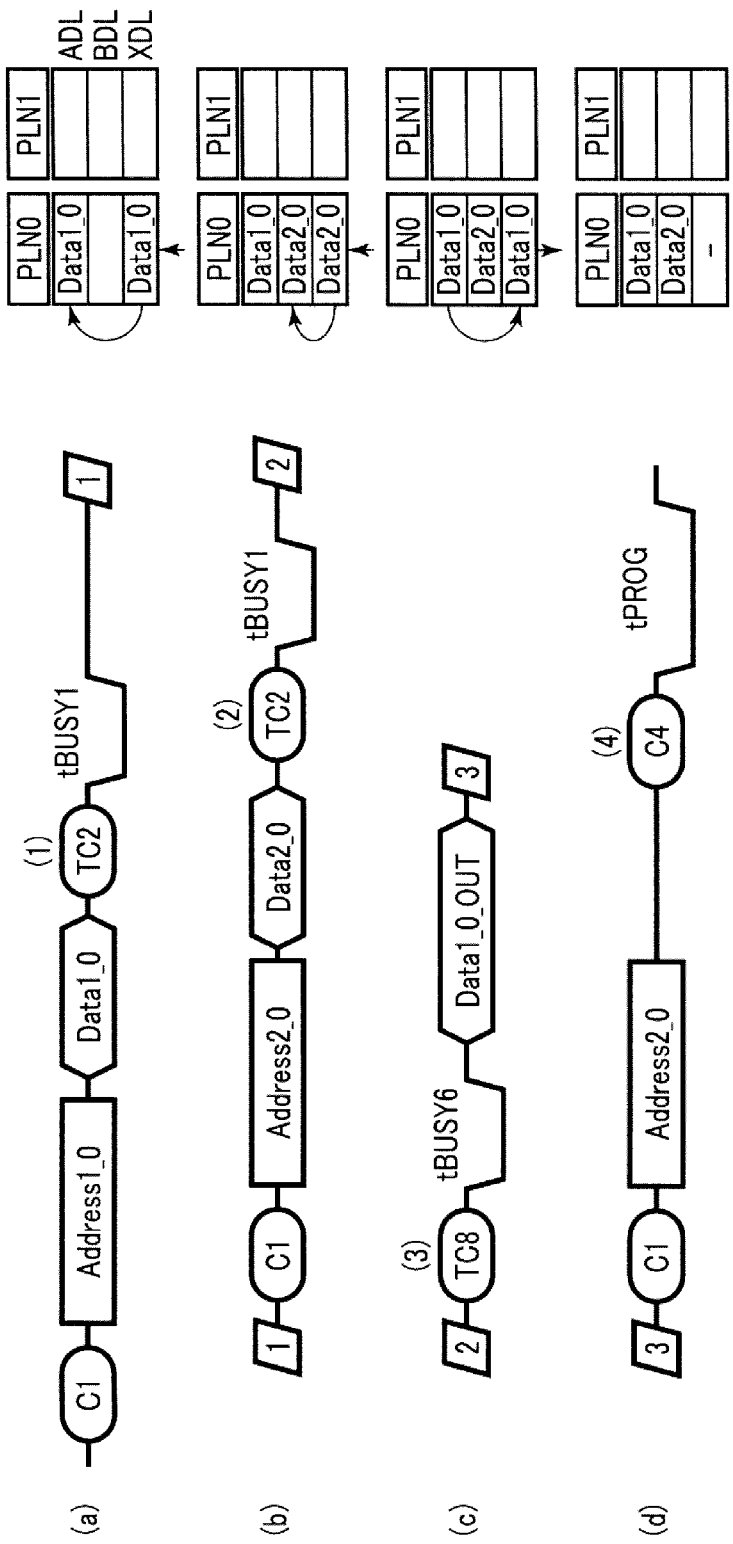
FIG. 16 illustrates a sequence of commands and data transmitted during a data writing operation and a stored state of data in a sense unit of the semiconductor memory device according to a sixth embodiment.

As shown in FIG. 16, after a first data reception is performed (reference numeral (1) of FIGS. 16 and 17), the sense unit 113 stores the first data "Data1_0" in the second cache 117_0.

Subsequently, after a second data reception is performed (reference (2) of FIGS. 16 and 17), the second data "Data2_0" is stored in the third cache 118_0.

Subsequently, when a third data transmission is carried out (reference numeral (c) of FIG. 16), the controller 200 transmits a command "TC8".

After a third data reception is performed (reference numeral (3) of FIGS. 16 and 17), a signal DoPLN0 is set to be at an "H" level. A signal CMD_TC8 is set to be at an "H" level so as to correspond to the command "TC8".

Since the signal DoPLN0 is set to be at an "H" level and the signal PLN0_PG2 is set to be at an "L" level, the sense unit 113 transmits the data "Data1_0" of the second cache 117_0 to the first cache 116_0. In this case, the cache 117_0 stores the data. The NAND flash memory 100 transmits the data ("Data1_0_OUT") of the first cache 116_0 to the controller 200. Hereinafter, a period of a busy state corresponding to the command "TC8" is referred to as tBUSY6. Since a data output operation from the NAND flash memory 100 to the controller 200 is included, the processing time at the period tBUSY6 becomes longer than that at the period tBUSY1.

Subsequently, when a fourth data transmission is carried out (reference (d) of FIG. 16), the controller 200 transmits a command "C1", an address signal "Address2_0", and a command "C4".

The NAND flash memory 100 writes the data stored in the second cache 117_0 and the third cache 118_0 in the memory cell array 111_0.

Although the data are transferred to the first cache 116_0 from the second cache 117_0 in response to the address signals (the signal DoPLN0 and the signal PLN0_PG2) in the present embodiment, the controller 200 may designate the second cache 117 or the third cache 118 by the command. More specifically, for example, the controller 200 may use a command "TC8_1" when the data are transferred from the second cache 117 to the first cache 116, and may use a command "TC8_2" when the data are transferred from the third cache 118 to the first cache 116. For example, in the third data transmission of FIG. 16, the controller 200 may transmit an address signal for designating the second cache 117 or the third cache 118 before the command "TC8" is transmitted. For example, the NAND flash memory 100 may transmit the data of the second cache 117 to the first cache 116 in response to the command "TC8". In this case, for example, it is possible to transmit the data to the first cache 116 via the second cache 117 by continuously performing the swapping operation of the data corresponding to the command "TC7" and the transmission operation of the data corresponding to the command "TC8" on the data of the third cache. Such a method of designating the cache is not limited.

The second cache 117 and the third cache 118 may not store the data after the data are transmitted. That is, in the second cache 117 and the third cache 118, the stored data may be erased after the data are transmitted to the first cache 116.

Although the command "TC8" is the command for transmitting the data to the first cache 116 and reading the data into the controller 200 in the above description, the command "TC8" may be a command for commanding the data transmission to the first cache 116, and the reading of the data from the first cache 116 into the controller 200 may be commanded by a separate command.

6.3 Advantage of Present Embodiment

According to the present embodiment, it is possible to improve the processing capability as in the first embodiment.

According to the present embodiment, the controller 200 can read the data from the second cache 117 and the third cache 118. Thus, it is possible to use the second cache 117 and the third cache 118 as the memory regions of the controller 200, and thus, it is possible to improve the processing capability of the controller 200.

For example, the controller 200 can store the write data input from the host device within the second cache 117 or the third cache 118, and can perform another process in the meantime. Thus, it is possible to improve the processing capability by efficiently using the memory regions within the controller 200. For example, when correction data for an ECC process is generated in the ECC circuit 206, the controller 200 may read the data stored in the second cache 117 or the third cache 118, may write the correction data for an ECC process, may add a code for the ECC process to the write data, and then may update the data by overwriting the data as described in the second embodiment. As stated above, it is possible to improve the processing efficiency of the entire memory system by facilitating the handling of the data.

7. Seventh Embodiment

Hereinafter, a semiconductor memory device and a memory system according to a seventh embodiment will be described. In the present embodiment, the full sequence operation will be described in detail. In the present embodiment, a three-dimensional stacked NAND flash memory will be described as an example of the NAND flash memory.

Configuration of Nonvolatile Semiconductor Memory Device

Figure 22:
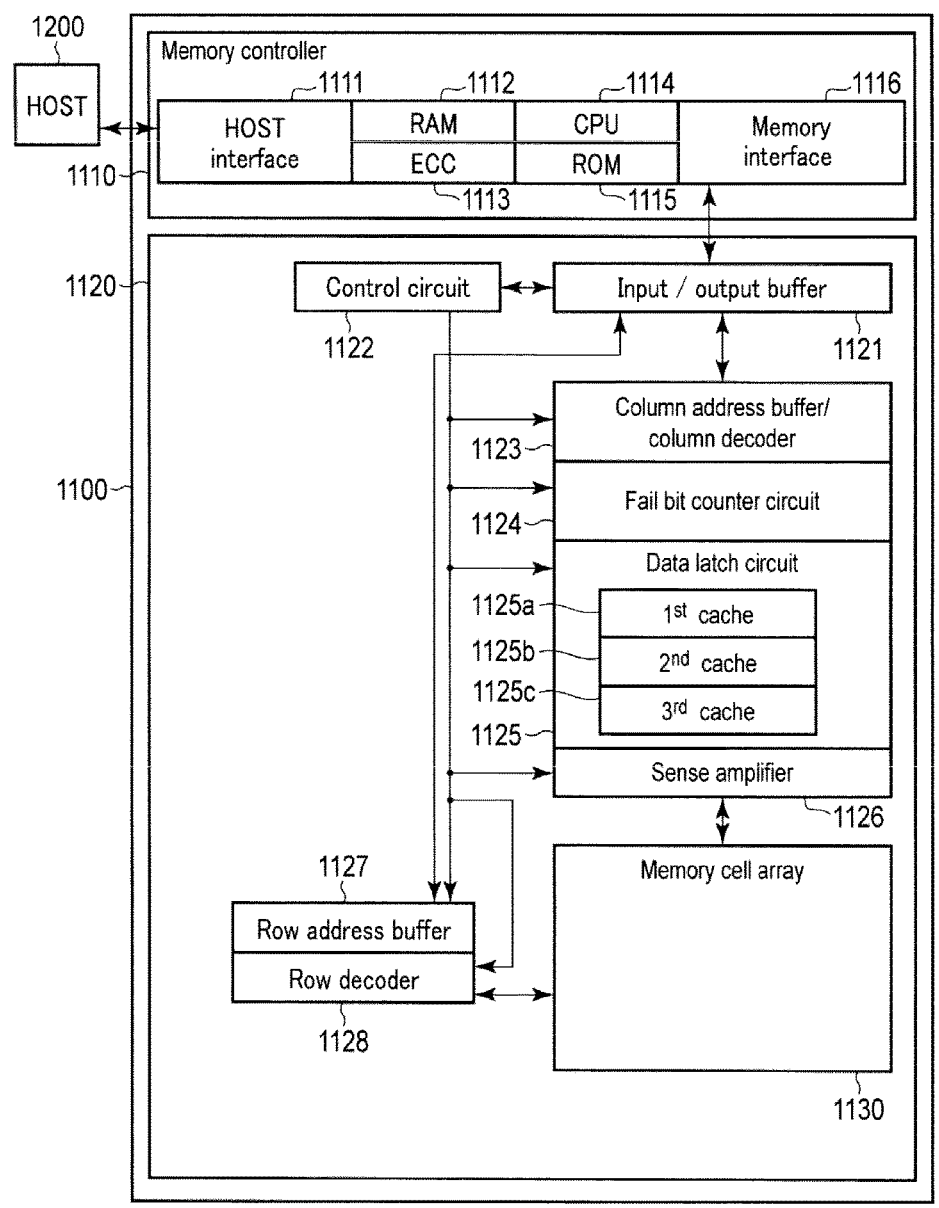
FIG. 22 is a block diagram showing a circuit configuration of a three-dimensional stacked nonvolatile semiconductor memory device according to a seventh embodiment.

A three-dimensional stacked nonvolatile semiconductor memory device according to the seventh embodiment will be described with reference to FIG. 22.

A three-dimensional stacked nonvolatile semiconductor memory device (referred to as a memory system) 1100 according to the present embodiment includes a memory controller 1110 and a NAND flash memory 1120.

Memory Controller

The memory controller 1110 includes a host interface 1111, a random access memory (RAM) 1112, an error-correcting code (ECC) circuit 1113, a central processing unit (CPU) 1114, a read only memory (ROM) 1115, and a flash memory interface 1116.

The memory controller 1110 outputs a command required for the operation of the NAND flash memory 1120, reads data from the NAND flash memory 1120, writes the data in the NAND flash memory 1120, or erases the data of the NAND flash memory 1120.

The host interface 1111 is connected to a host device (external device) 1200 of a personal computer through a data bus. Data are transmitted and received between the host device 1200 and the memory system 1100 through the host interface 1111.

The RAM 1112 is, for example, a volatile memory, and stores, for example, an operation program for operating the CPU 1114.

The error-correcting code (ECC) circuit 1113 receives data from the host device 1200, adds an error-correcting code to the data, and supplies the data including the error-correcting code to, for example, the flash memory interface 1116. The ECC circuit 1113 receives the data supplied from the NAND flash memory 1120 through the flash memory interface 1116, and performs the error correction on the data by using the error-correcting code.

The central process unit (CPU) 1114 manages the entire operation of the memory system 1100. The CPU 1114 controls the NAND flash memory 1120 based on the data stored in the RAM 1112 and the ROM 1115.

The read only memory (ROM) 1115 is a nonvolatile memory, and stores, for example, an operation program for operating the CPU 1114.

The NAND flash memory 1120 is connected to the flash memory interface 1116 through the data bus.

NAND Flash Memory

The NAND flash memory 1120 includes an input and output buffer 1121, a control circuit 1122, a column address buffer/column decoder 1123, a fail bit counter circuit 1124, a data latch circuit 1125, a sense amplifier 1126, a row address buffer 1127, a row decoder 1128, and a memory cell array 1130.

The memory cell array 1130 is a three-dimensional stacked nonvolatile semiconductor memory device in which a plurality of nonvolatile memory cell transistors is stacked on a semiconductor substrate in a vertical direction. The detailed configuration of the memory cell array 1130 will be described below.

The sense amplifier 1126 senses data read from the memory cell transistor into a bit line in a SEN node (not shown) at the time of reading data. The sense amplifier 1126 sets a write voltage corresponding to write data to the SEN node of the sense amplifier at the time of writing data. The reading and writing of the data in and from the memory cell array 1130 are performed for each of the plurality of memory cell transistors. The sense amplifier 1126 receives a bit line selection signal input from the column address buffer/column decoder 1123, selects any one of bit lines BL via a bit line selection transistor, and drives the selected line.

The data latch circuit 1125 includes a first cache 1125*a*, a second cache 1125*b*, and a third cache 1125*c* which are respectively SRAMs. The first cache 1125*a*, the second cache 1125*b*, and the third cache 1125*c* store data transmitted from the memory controller 1110 or a verify result detected by the sense amplifier 1126.

The fail bit counter circuit 1124 counts the number of bits in which the program operation is not completed from the verify result stored in the data latch circuit 1125.

The column address buffer/column decoder 1123 temporarily stores a column address signal input from the memory controller 1110 via the input and output buffer 1121. A selection signal for selecting any one of the bit lines BL is output to the sense amplifier 1126 in response to the column address signal.

The row decoder 1128 decodes the row address signal input via the row address buffer 1127, selects the word line WL and the select gate lines SGD and SGS of the memory cell array, and drives the selected lines. The row decoder 1128 includes a portion which selects a block of the memory cell array 1130 and a portion which selects a page.

The NAND flash memory 1120 according to the present embodiment includes an external input and output terminal I/O (not shown), and data are delivered between the input and output buffer 1121 and the memory controller 1110 through the external input and output terminal I/O. The address signal input through the external input and output terminal I/O is output to the row decoder 1128 and the column address buffer/column decoder 1123 via the row address buffer 1127.

The control circuit 1122 performs sequential controls of the write and erase operations of data and read operation based on various external control signals (the write enable signal WEn, the read enable signal REn, the command latch enable signal CLE, and the address latch enable signal ALE) supplied via the memory controller 1110. For example, the control circuit 1122 includes a register, and stores a value related to a value counted by the fail bit counter circuit 1124 or a value related to the number of times a program voltage is applied. The control circuit 1122 compares the number of bits in which the program operation is not completed with the number of set allowable fail bits, and determines whether or not the program operation is Pass or Fail. The control circuit 1122 includes a counter that counts the number of times a program pulse is applied therein. The control circuit 1122 compares the counted number of times the program pulse is applied with the number of times stored in the register.

Memory Cell Array

Figure 23:
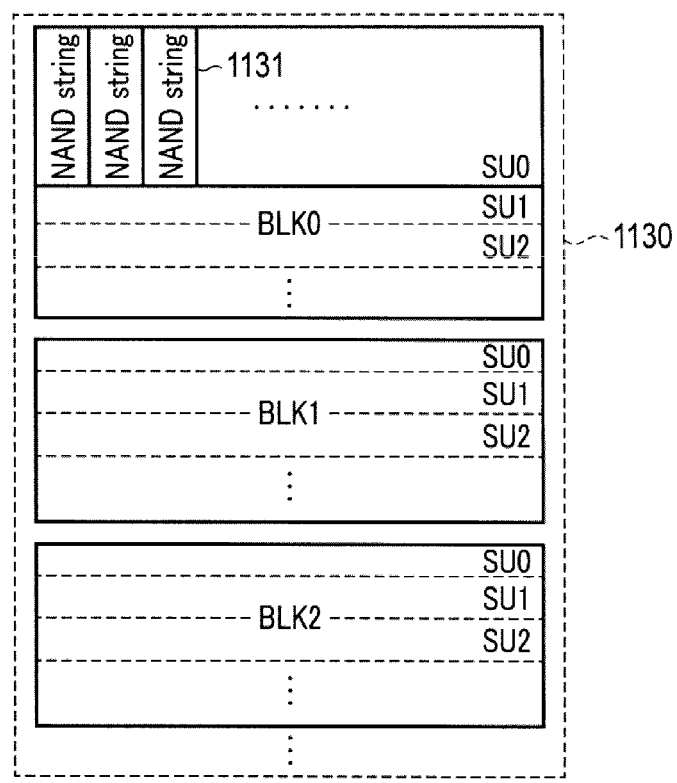
FIG. 23 is a block diagram of a memory cell array in the semiconductor memory device according to the seventh embodiment.

As shown in FIG. 23, the memory cell array 1130 includes a plurality (three in the example of FIG. 23) of blocks BLK (BLK0, BLK1, BLK2, . . . ) which is a set of a plurality of nonvolatile memory cells, which is respectively associated with word lines and bit lines.

Each of the blocks BLK includes a plurality of string units SU (SU0, SU1, SU2, . . . ) which is a set of NAND strings 1131 in which memory cells are connected in series. Of course, the number of blocks within the memory cell array 1130 or the number of string units within one block BLK may be arbitrarily set.

Hereinafter, the block BLK0 will be described with reference to FIG. 24.

Figure 24:
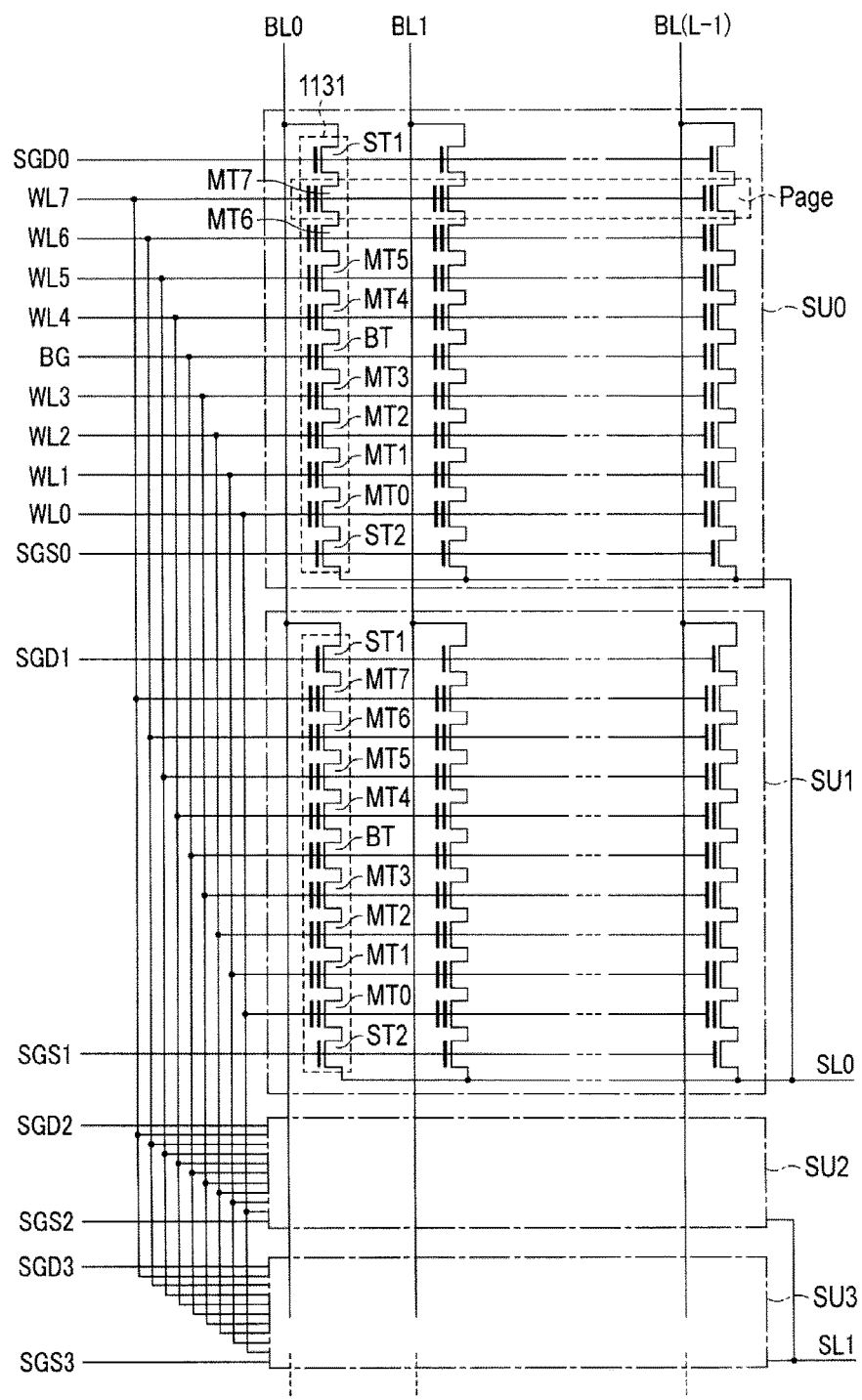
FIG. 24 is a circuit diagram of a block of the memory cell array.

As shown in FIG. 24, the block BLK0 includes, for example, four string units SU (SU0 to SU3). Each of the string units SU includes a plurality of NAND strings 1131.

Each of the NAND strings 1131 includes, for example, eight memory cell transistors MT (MT0 to MT7), select transistors ST1 and ST2, and a back gate transistor BT. The memory cell transistor MT includes a stacked gate including a control gate and a charge storage layer, and stores data in a nonvolatile manner. The number of memory cell transistors MT is not limited to 8, and may be 16, 32, 64, or 128. The number of memory cell transistors is not limited.

Similarly to the memory cell transistor MT, the back gate transistor BT includes a stacked gate including a control gate and a charge storage layer. The back gate transistor BT does not store data, and functions as a simple current path at the time of writing, reading and erasing data.

The memory cell transistors MT and the back gate transistor BT are arranged between the select transistors ST1 and ST2 such that the current paths thereof are connected in series. The back gate transistor BT is provided between the memory cell transistors MT3 and MT4. The current path of the memory cell transistor MT7 at one end of the series connection is connected to one end of the current path of the select transistor ST1, and the current path of the memory cell transistor MT0 at the other end thereof is connected to one end of the current of the current path of the select transistor ST2.

Gates of the select transistors ST1 of the string units SU0 to SU3 are respectively connected to select gate lines SGD0 to SGD3, and gates of the select transistors ST2 are respectively connected to select gate lines SGS0 to SGS3. In contrast, the control gates of the memory cell transistors MT0 to MT7 within the same block BLK0 are connected in common to word lines WL0 to WL7. The control gates of the back gate transistors BT of the string units SU0 to SU3 are connected in common to a back gate line BG.

That is, the word lines WL0 to WL7 and the back gate line BG are connected in common between the plurality of string units SU0 to SU3 within the same block BLK0, whereas the select gate lines SGD and SGS are independently provided for each of the string units SU0 to SU3 even within the same block BLK0.

Among the NAND strings 1131 arranged in a matrix within the memory cell array 1130, the other ends of the current paths of the selection transistors ST1 of the NAND strings 1131 present in the same row are connected in common to any one of the bit lines (BL0 to BL(L-1), (L-1) is a natural number of 1 or more). That is, the bit line BL connects the NAND strings 1131 in common between the plurality of blocks BLK. The other ends of the current paths of the selection transistors ST2 are connected in common to a source line SL. For example, the source line SL connects the NAND strings 1131 in common between the plurality of blocks.

As described above, the data of the memory cell transistors MT within the same blocks BLK are collectively erased. In contrast, the reading and writing of the data are performed collectively based on the plurality of memory cell transistors MT connected in common to any of the word lines WL in any one of the string units SU of any one of the blocks BLK. A write unit of the data is referred as to a "page".

Figure 25:
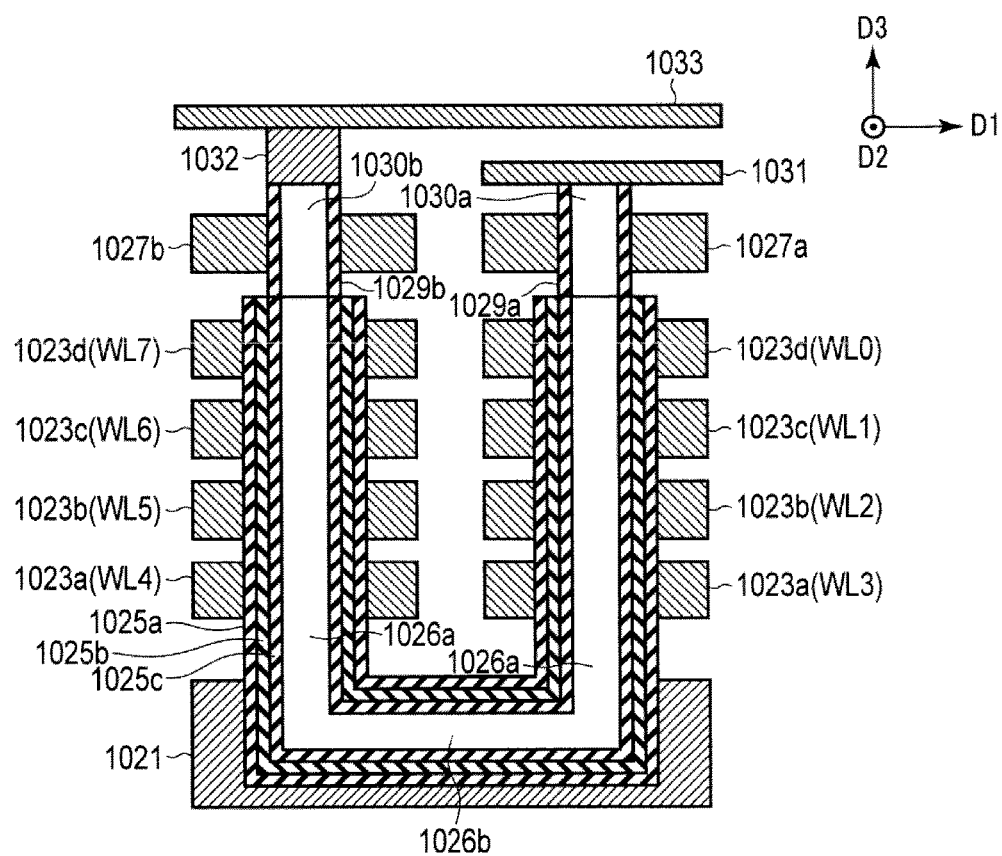
FIG. 25 is a cross-sectional view of a NAND string of the memory cell array.

A configuration example of the memory cell array 1130 will be simply described with reference to FIG. 25. The structure shown in FIG. 25 is plural in number, and is arranged in a depth direction (D2) of a paper surface of FIG. 25. One string unit SU is formed by sharing the word lines WL, the select gate lines SDG and SGS and the back gate line BG.

AS shown in FIG. 25, a conductive layer (for example, a polycrystalline silicon layer) 1021 functioning as the back gate line BG is formed on a semiconductor substrate. A plurality of conductive layers (for example, polycrystalline silicon layers) 1023a to 1023d serving as the word lines WL is formed on the conductive layer 1021. Conductive layers (for example, polycrystalline silicon layers) 1027a and 1027b functioning as the select gate lines SGD and SGS are formed on the conductive layer 1023d.

A memory hole is formed so as to penetrate the conductive layers 1027a, 1027b, and 1023a to 1023d. A block insulating film 1025a, a charge storage layer (insulating film) 1025b, and a gate insulating film 1025c are sequentially formed on a side surface of the memory hole, and conductive films 1026a and 1026b are embedded in the memory hole. The conductive films 1026a and 1026b serve as the current paths of the NAND string 1131, and are regions where channels are formed at the time of operating the memory cell transistor MT.

Conductive films 1030a and 1030b are formed on the conductive films 1026a, a source line layer 1031 is formed on the conductive film 1030a, and a bit line layer 1033 is formed on the conductive film 1030b with the conductive film 1032 interposed therebetween.

Threshold Voltage Distribution of Memory Cell Transistor

Hereinafter, a threshold voltage distribution of a memory cell transistor MT according to the present embodiment will be described with reference to FIG. 26.

Figure 26:
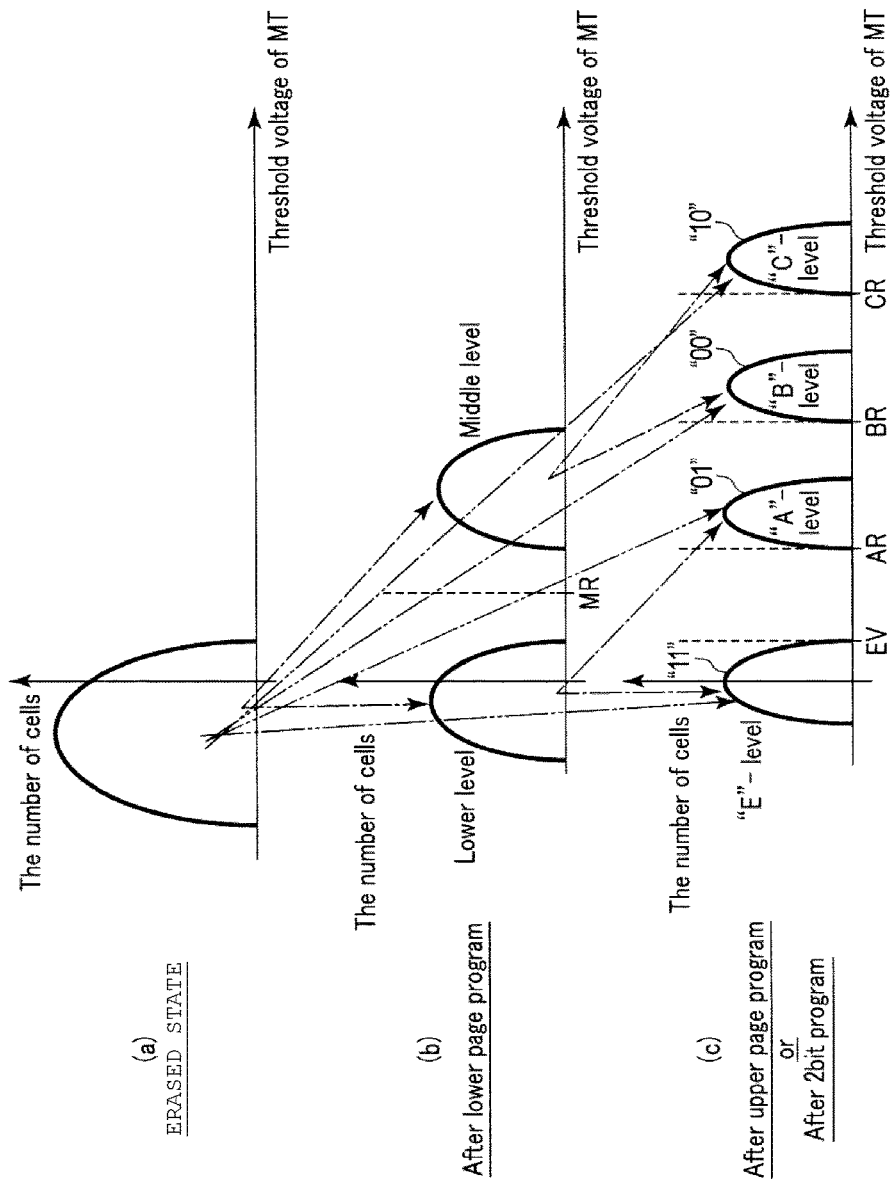
FIG. 26 illustrates a threshold voltage distribution of a memory cell transistor in the memory cell array according to the seventh embodiment. Section (a) shows an initial state of the threshold voltage distribution, section (b) shows a threshold voltage distribution after a lower bit has been written, and section (c) shows a threshold voltage distribution after an upper bit has been written or a 2-bit program has been completed.

As shown in FIG. 26, the memory cell transistor MT can store, for example, 2-bit data according to the threshold voltage thereof. The 2-bit data are, for example, an "E" level, an "A" level, a "B" level, and a "C" level in ascending order of the threshold. Each level has a 2-bit address of an upper bit and a lower bit. For example, "E" is assigned "11", "A" is assigned "01", "B" is assigned "00", and "C" is assigned "10". "11", "01", "00", and "10" are represented such that a left number is assigned to the upper bit and a right number is assigned to the lower bit. In the present embodiment, a write unit of the data of the lower bit is referred as to a "lower page". A write unit of the data of the upper bit is referred as to an "upper page".

The "E" level is a threshold voltage level in a state in which data are erased, has, for example, a negative value (may have a positive value), and is lower than a verify voltage EV. The levels "A" to "C" are thresholds in a state in which charges are injected into the charge storage layer, and the "A" level is a threshold voltage level which is higher than a read level "AR" and is lower than a read level "BR". The "B" level is a threshold voltage level which is higher than the read level "BR" and is lower than a read level "CR". The "C" level is a threshold voltage level which is higher than the read level "CR".

As stated above, the memory cell individually transistors can store 2-bit data (4-level data) by acquiring four thresholds.

As shown in section (a) of FIG. 26, a distribution in an erase state of the memory cell transistor MT is an "E" level.

When the lower bit is written, a single-valued threshold voltage distribution shown in section (a) of FIG. 26 is changed to a two-valued threshold voltage distribution shown in section (b) of FIG. 26. The read operation is performed by supplying a voltage "MR" to a word line, and thus, it is possible to determine whether or not the threshold voltage of the memory cell is higher or lower than the voltage "MR". As a result, it is possible to read the data.

When the write operation is performed on the upper page, the two-valued threshold voltage distribution shown in section (b) of FIG. 26 is changed to a four-valued threshold voltage as shown in section (c) of FIG. 26.

Data Write Operation According to Seventh Embodiment

Figure 27:
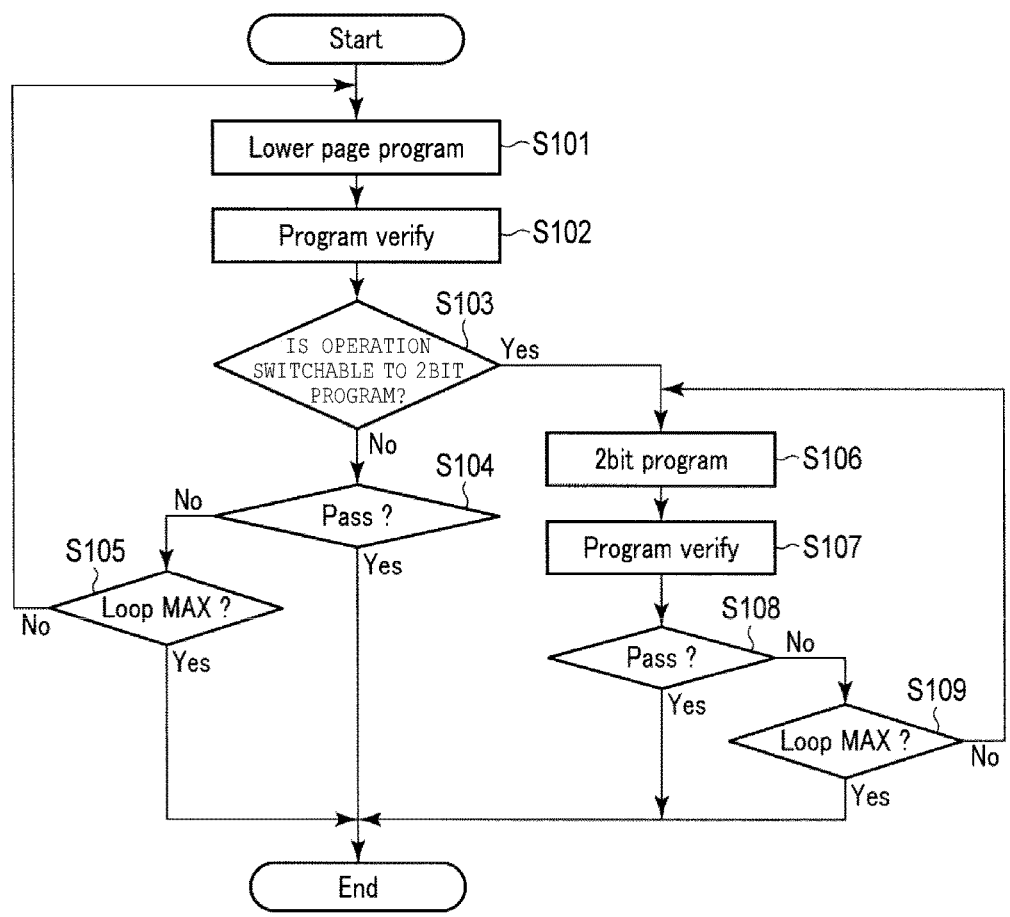
FIG. 27 is a flowchart of a write operation according to the seventh embodiment.

Hereinafter, a data write operation according to the present embodiment will be described with reference to FIG. 27. The write operation includes a program operation of increasing the threshold voltage by injecting the charges into the charge storage layer, and a program verify operation of checking a change of the threshold voltage distribution as the result of the program operation. The process shown in FIG. 27 is mainly performed by the controller of the control circuit 1122.

[S101]

The NAND flash memory 1120 sequentially receives a write command, an address of the lower page, data of the lower page, and a write start command from the memory controller 1110. In this case, the control circuit 1122 stores the data of the lower page in the third cache 1125c. In addition, the control circuit stores the data of the lower page in the second cache 1125b. In the following description, for the simplicity, the write command, the address, the data, and the write start command are collectively referred to as "command sequence".

Subsequently, when the write start command is received, the control circuit 1122 starts the program operation of the lower page. Specifically, the row decoder 1128 applies a program voltage VPGM (initial program application is a voltage VPG (initial for lower)) to the selection word line WL in response to the command of the control circuit 1122, and the sense amplifier 1126 applies a voltage corresponding to the write data to the bit line BL. Thus, the data developed in the third cache 1125c are programmed for each memory cell transistor MT.

[S102]

Subsequently, the row decoder 1128 applies a verify voltage VPVFY to the selection word line WL in response to the command of the control circuit 1122, and performs the program verify operation. The verify result is stored in the third cache 1125c, and is overwritten in this cache every time.

[S103]

The control circuit 1122 determines whether or not a 2-bit program (write) operation (full sequence) can be carried out. The 2-bit program refers to an operation of writing both the data of the lower page and the data of the upper page in the memory cell transistor MT.

The determination method performed by the control circuit 1122 will be described below.

{Method 1}

The control circuit 1122 determines whether or not the command sequence (the write command, the address of the upper page, the data of the upper page and the write start command) related to the upper page belonging to the same word line WL as that of the lower page are received from the memory controller 1110. When the data of the upper page are received, the control circuit 1122 stores the data of the upper page in the first cache 1125a. Hereinafter, the upper page belonging to the same word line WL as that of the lower page in which the write operation is performed is simply referred to as an "upper page" for the simplicity.

{Method 2}

The control circuit 1122 reads the data by the program verify operation of step S102. The control circuit 1122 determines whether or not the threshold voltage of the memory cell transistor MT is increased up to a desired value based on the read data. The control circuit 1122 compares the number of bits in which the program operation is not completed with a predetermined bit number set within the register of the control circuit 1122.

{Method 3}

The control circuit 1122 counts the number of times (referred to as the number of times the pulse has been applied or the loop count) the program operation (or the write operation including the program operation and the program verify operation) of the lower page of step S101 has been performed, and determines whether or not the number of times exceeds a predetermined number.

The control circuit 1122 determines whether or not the operation can be switched to the 2-bit program operation by performing Method 1 (Determination Method 1), a combination (Determination Method 2) of Method 1 and Method 2, a combination (Determination Method 3) of Method 1 and Method 3, or a combination (Determination Method 4) of Method 1 to Method 3.

{Determination Method 1}

An example in which the control circuit 1122 uses Determination Method 1 will be described. When it is determined that the command sequences related to the upper page is received (step S103, YES), the control circuit 1122 proceeds to step S106 since it is possible to switch the operation to the 2-bit program operation. When the command sequence is not received (step S103, No), the control circuit 1122 proceeds to step S104 since it is not possible to switch the operation to the 2-bit program operation.

{Determination Method 2}

An example in which the control circuit 1122 uses Determination Method 2 will be described below. When the command sequence related to the upper page is received and it is determined that the number of bits in which the program operation is not completed is equal to or less than a predetermined bit number (step S103, YES), the control circuit 1122 proceeds to step S106 since it is possible to switch the operation to the 2-bit program operation. When the command sequence is not received or it is determined that the number of bits in which the program operation is not completed is greater than the predetermined bit number (step S103, NO), the control circuit 1122 proceeds step S104 since it is not possible to switch the operation to the 2-bit program operation.

{Determination Method 3}

An example in which the control circuit 1122 uses Determination Method 3 will be described below. When the command sequence related to the upper page is received and it is determined that the number of times the program operation is performed is equal to or greater than a predetermined value (step S103, YES), the control circuit 1122 proceeds step S106 since it is possible to switch the operation to the 2-bit program operation. When the command sequence is not received or it is determined that the number of times the program operation is performed does not reach the predetermined number (step S103, NO), the control circuit 1122 proceeds to step S104 since it is not possible to switch the operation to the 2-bit program operation.

{Determination Method 4}

An example in which the control circuit 1122 uses Determination Method 4 will be described below. When the command sequence related to the upper page is received, the number of bits in which the program operation is not completed is equal to or less than the predetermined bit number, and the number of times of the program operation is performed is equal to or greater than the predetermined value (step S103, YES), the control circuit 1122 proceeds to step S106 since it is possible to switch the operation to the 2-bit program operation. When the command sequence related to the upper page is not received, the number of bits in which the program operation is not completed is greater than the predetermined bit number, and the number of times of the program pulse is applied does not reach the predetermined value (step S103, NO), the control circuit 1122 proceeds to step S104 since it is not possible to switch the operation to the 2-bit program operation.

The control circuit 1122 may add other determination methods to Method 1 as long as the determination method of at least Method 1 is included.

[S104]

In step S103, when the control circuit 1122 determines that the 2-bit program operation is not performed (step S103, NO), the control circuit 1122 determines whether or not all the bits in the selection page are Pass in the verify operation.

Specifically, the control circuit 1122 reads the data by the program verify operation of step S102. The control circuit 1122 determines whether or not the threshold voltage of the memory cell transistor MT is increased up to a desired value based on the read data. Hereinafter, the controller distinguishes the bits which are increased up to a desired value, that is, the bits in which the program operation is completed and the bits which are not increased, that is, the bits in which the program operation is not completed, and the control circuit 1122 determines whether the program operation is Pass or Fail by comparing the number of bits (the number of fail bits) in which the program operation is not completed with the number of set allowable bits.

When it is determined that the program verify operation in the selection page is Pass (step S104, YES), the control circuit 1122 ends the write operation on the page.

When Method 2 is performed in step S103, the control circuit 1122 uses the determination result of Method 2 in step S104.

[S105]

In step S105, when it is determined that the program operation is Fail (step S104, NO), the control circuit 1122 determines whether or not the loop count of the program has reached a predetermined maximum value. When it is determined that the loop count of the program has reached the maximum value (step S105, YES), the control circuit 1122 ends the write operation on the page.

When the control circuit 1122 determines that the loop count of the program has not reached the maximum value (step S105, NO), for example, the control circuit 1122 updates the program voltage VPGM with (VPGM+ΔVx), and returns to step S101.

[S106]

In step S103, when the control circuit 1122 determines that the 2-bit program operation is performed (step S103, YES), the control circuit 1122 stops the write operation of the lower page, and starts the 2-bit program operation by using the data and address of the lower page and the data and address of the upper page. When the operation is switched to the 2-bit program operation, it is not necessary to form the two-valued threshold voltage distribution as shown in (b) of FIG. 26 by the write operation of the lower page.

In this case, the program voltage VPGM for the lower page program which is stepped up at the time of the write operation of the lower page (step S101 to S105) is initialized to a voltage for the 2-bit program. The initial program application in the 2-bit program operation is the voltage VPGM (initial for 2 bit). In the 2-bit program operation, the writing based on the data of the lower page based on the stored data of the second cache 125*b* and the data of the upper page stored in the first cache 125*a* is started.

[S107]

As in step S102, the row decoder 1128 performs the program verify operation.

[S108]

As in step S104, the control circuit 1122 performs the program verify operation. If the program verify operation in the selection page is Pass (step S108, YES), the write operation on the page is ended.

[S109]

As in step S105, when it is determined that the program operation is Fail (step S108, NO), the control circuit 1122 determines whether or not the loop count of the program has reached the maximum value. When it is determined that the loop count of the program has reached the maximum value (step S109, YES), the control circuit 1122 ends the write operation on the page.

When the control circuit 1122 determines that the loop count of the program had not reached the maximum value (step S109, NO), for example, the control circuit 1122 updates the program voltage VPGM with (VPGM+ΔVx), and returns to step S106.

Similarly to the program operation of the lower page, the program voltage VPGM is stepped up by ΔVx even in the 2-bit program operation, but the present embodiment is not necessarily limited thereto. The same is true of the following embodiments.

Specific Example 1 of Data Write Operation According to Seventh Embodiment

Hereinafter, Specific Example 1 (first example) of a data write operation according to a seventh embodiment will be described with reference to FIG. 28. In Specific Example 1, an operation when Determination Method 3 is adopted in step S103 will be described. The ready/busy shown in FIG. 28 indicates a state of a pin provided in the NAND flash memory 1120 (not shown), and indicates whether or not the cache is occupied in the internal operation of the NAND flash memory. For example, the state being set to be at an "H" level means that at least one cache is released and the data can be input.

[Time T0]

At time T0, the NAND flash memory 1120 starts receiving the command sequence (the write command (80), the address of the lower page, the data of the lower page, and the write start command (15)) related to the lower page from the memory controller 1110.

[Time T1]

At time T1, the control circuit 1122 starts developing the data of the lower page in the third cache 1125*c*. From time T1 to time T2, the NAND flash memory 1120 is in the busy state.

The operations of step S101 to S105 are performed.

[Time T2]

In Specific Example 1, it is assumed that the control circuit 1122 starts the 2-bit program operation when the command sequence related to the upper page can be received and it is determined that the number of times the write operation has been performed is equal to or greater than a predetermined number (here, for example, three times).

[Time T3]

Until time T3, the command sequence related to the upper page is input to the NAND flash memory 1120 for a period during which the write operation of the lower page in the memory cell array 1130 is performed.

[Time T4]

At time T4, since it is determined that it is possible to change the operation to the 2-bit program operation in the determination in step S103 after the write operation has been performed three times, the control circuit 1122 starts the 2-bit program operation.

When the 2-bit program operation is performed, the control circuit 1122 initializes the program voltage VPGM (VPGM (initial for lower)+ΔVx+ΔVx) for the lower page program which is stepped up in the write operation of the lower page (from time T2 to time T3) to the voltage for the 2-bit program. The initial program application in the 2-bit program operation is the voltage VPGM (initial for 2 bit)

(the voltage VPGM (initial for 2 bit)<the stepped-up program voltage VPGM for the lower page program).

Specific Example 2 of Data Write Operation According to Seventh Embodiment

Figure 29:
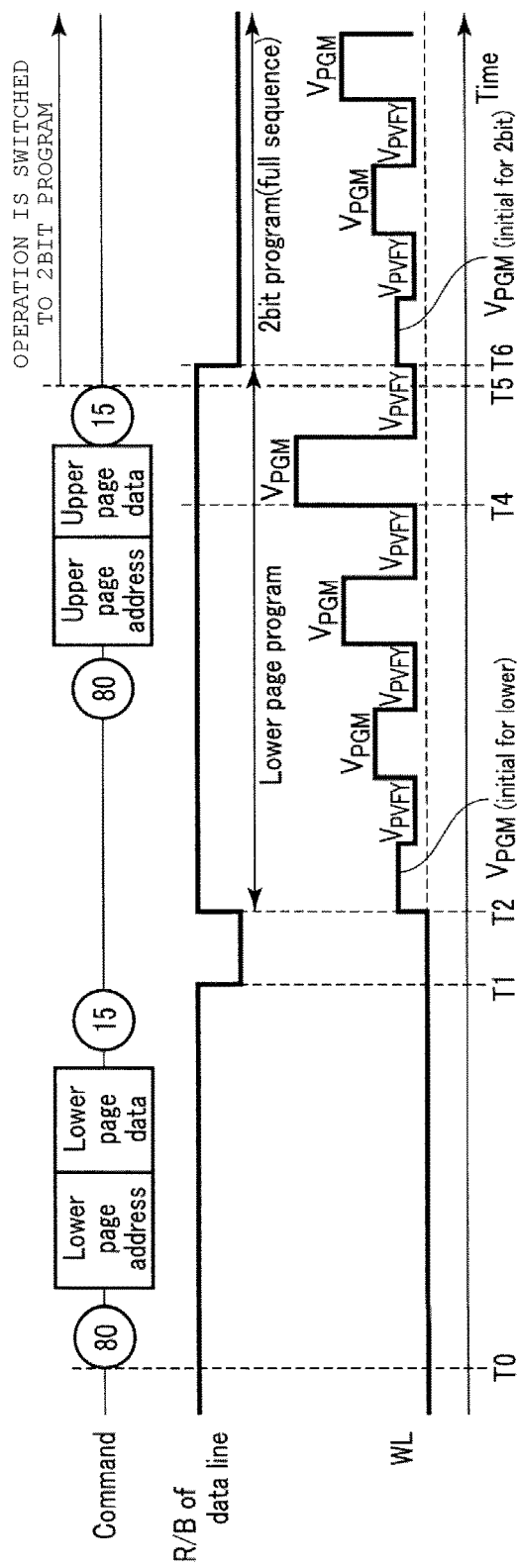
FIG. 29 is a second example of the write operation according to the seventh embodiment.

Hereinafter, Specific Example 2 (second example) of the data write operation according to the seventh embodiment will be described with reference to FIG. 29. In Specific Example 2, Determination Method 3 is adopted in step S103. The ready/busy shown in FIG. 29 indicates the ready/busy of the NAND flash memory 1120.

[Time T0] to [Time T2]

Figure 28:
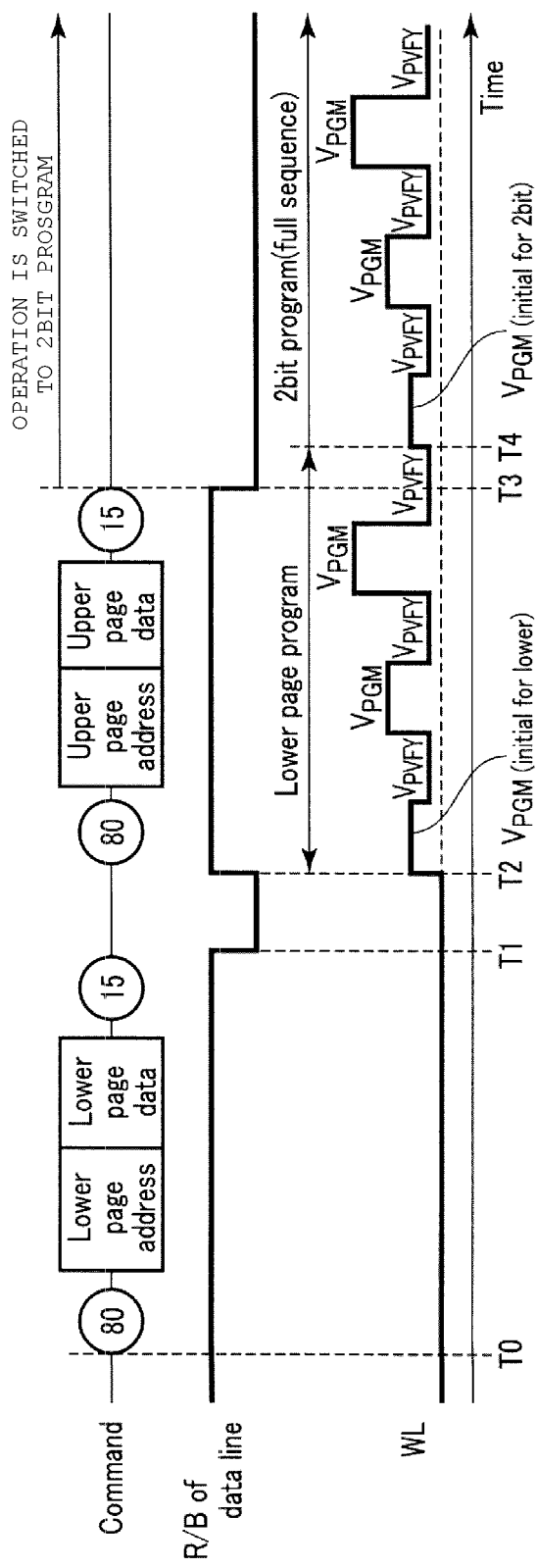
FIG. 28 is a first example of the write operation according to the seventh embodiment.

The same operations as those from the time T0 to the time T2 described in FIG. 28 are performed.

[Time T4]

At time T4, the command sequence related to the upper page is not input to the NAND flash memory 1120 in step S103 immediately after the write operation has been performed three times. Thus, the control circuit 1122 determines that it is not possible to change the operation to the 2-bit program operation, and change the operation to the fourth write operation.

[Time T5]

At time T5, the input of the command sequence related to the upper page to the NAND flash memory 1120 is completed for a period during which the write operation of the lower page in the memory cell array 1130 is performed.

[Time T6]

Since it is determined that it is possible to switch the operation to the 2-bit program operation in the determination of step S103 after the program operation has been performed four times, the control circuit 1122 starts the 2-bit program operation.

Advantage of Data Write Operation According to Seventh Embodiment

According to the above-described embodiment, the memory system 1100 is capable of starting the 2-bit program operation under a predetermined condition even though all the bits in the selection page are not Pass in the verify operation in the write operation of the lower page in the memory cell array 1130.

More specifically, the control circuit 1122 determines whether or not at least the command sequence (the write command, the address, the data, and the write start command) related to the upper page belonging to the same word line WL as that of the lower page is received for a period during which the write operation of the lower page in the memory cell array 1130 is performed.

When it is determined that at least the command sequence related to the upper page belonging to the same word line WL as that of the lower page is received, the control circuit 1122 switched the operation to the 2-bit program operation based on the data and address of the lower page and the data and address of the upper page.

There is a method of writing data bit by bit in the operation of writing the 2-bit (four-valued) data. In this case, the data of the lower page of the 2 bits are initially written as shown in (b) of FIG. 26, and then, the data of the upper page are written as shown in (c) of FIG. 26. However, in such a writing method, it is not possible to change the operation to the write operation of the data of the upper page until the write operation of the data of the lower page is ended.

Meanwhile, as stated above, since the 2-bit program operation is performed before the write operation of the lower page is ended (the two-valued threshold voltage distribution is formed) by using the memory system 1100 according to the above-described embodiment, it is possible to start the 2-bit (four-valued) program at an earlier point of time. Accordingly, it is possible to provide the high-quality memory system 1100 capable of performing the write operation at a higher speed.

According to the seventh embodiment, the control circuit 1122 performs the determination of step S103 after the program verify operation of step S102, but the present embodiment is not limited thereto. For example, the control circuit 1122 may perform the determination of step S103 and steps S101 and S102 in parallel.

The control circuit 1122 performs the 2-bit program operation after the program verify operation related to the lower page of step S102 is ended, but the present embodiment is not limited thereto. For example, the control circuit 1122 may change the operation to the 2-bit program operation during the program operation of step S101 or the program verify operation of step S102. However, it is possible to check the program verify result of the lower page after the program verify operation related to the lower page of step S102 is ended, and the control circuit 1122 can derive a more preferable change timing.

8. Eighth Embodiment

Figure 30:
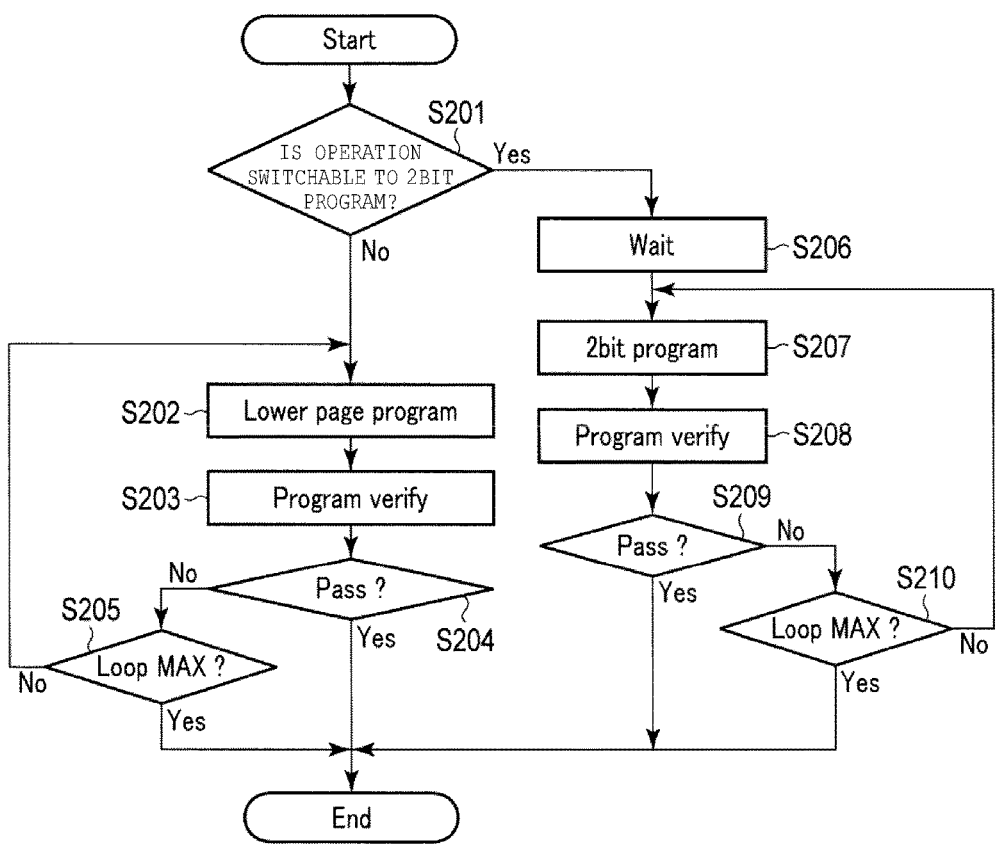
FIG. 30 is a flowchart of a write operation according to an eighth embodiment.
Figure 31:
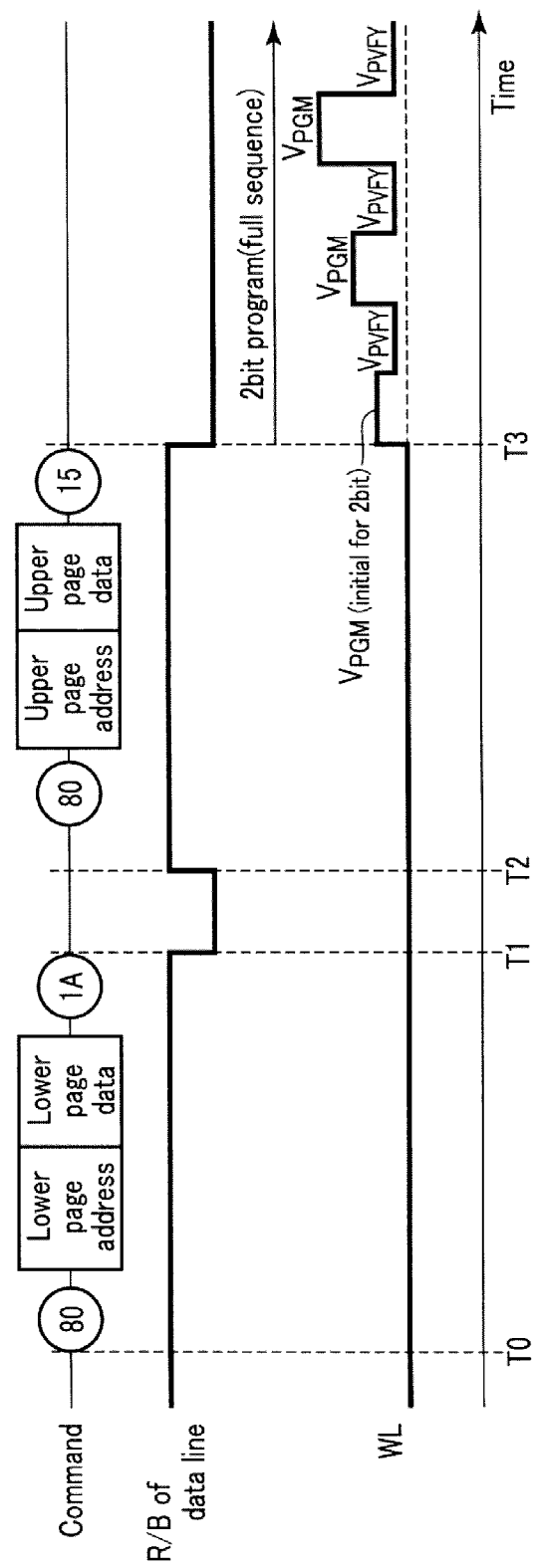
FIG. 31 is an example of the write operation according to the eighth embodiment.

Hereinafter, a memory system 1100 according to an eighth embodiment will be described with reference to FIGS. 30 and 31. The eighth embodiment corresponds to a case where the control circuit 1122 at one time performs the write operation of the upper page without performing the write operation of the lower page when a predetermined command is received in the seventh embodiment. Hereinafter, in the eighth embodiment, the elements having the substantially same functions and configurations as those in the above-described seventh embodiment will be described with the same reference numerals, and the redundant description thereof will be made only when necessary.

Data Write Operation According to Eighth Embodiment

Hereinafter, a data write operation according to an eighth embodiment will be described with reference to FIG. 30. Processes shown in FIG. 30 are mainly performed by the control of the control circuit 1122.

[S201]

The control circuit 1122 determines whether or not it is possible to change the operation to the 2-bit program operation (full sequence). Specifically, the control circuit 1122 determines whether or not the command sequence including not the write start command but a wait command is received from the memory controller 1110.

[S202]

When the command sequence which does not include the wait command and is related to the lower page is received from the memory controller 1110 (step S201, NO), the control circuit 1122 performs the same operation as that in step S101.

[S203]

Subsequently, the row decoder 1128 performs the same operation as that in step S102.

[S204]

Subsequently, the control circuit 1122 performs the same operation as that in step S104. If the program verify operation in the selection page is Pass (step S204, YES), the write operation on the page is ended.

[S205]

As in step S105, when it is determined that the program verify operation in the selection page is Fail (step S204, NO), the control circuit 1122 determines whether or not the loop count of the program has reached the maximum value. When it is determined that the loop count of the program has reached the maximum value (step S205, YES), the control circuit 1122 ends the write operation on the page.

When the control circuit 1122 determines that the loop count of the program has not reached the maximum value (step S205, NO), the control circuit 1122 updates the program voltage VPGM with (VPGM+ΔVx), and returns to step S202.

[S206]

In step S201, when the command sequence including a wait command (1A) is received from the memory controller 1110 (step S201, YES), the control circuit 1122 waits until the command sequence related to the upper page is received, without performing the write operation of the lower page.

[S207]

When the command sequence related to the upper page is received from the memory controller 1110, the control circuit 1122 starts the program operation for the 2-bit program operation (full sequence) by using the data and address of the lower page and the data and address of the upper page. The initial program application in the 2-bit program operation is the voltage VPGM (initial for 2 bit).

[S208]

As in step S107, the row decoder 1128 performs the program verify operation.

[S209]

As in step S204, the control circuit 1122 performs the program verify operation. If the program verify operation in the selection page is Pass (step S209, YES), the write operation on the page is ended.

[S210]

As in step S205, when it is determined that the program verify operation in the selection page is Fail (step S209, NO), the control circuit 1122 determines whether or not the loop count of the program has reached the maximum value. When it is determined that the loop count of the program has reached the maximum value (step S210, YES), the control circuit 1122 ends the write operation on the page.

When the control circuit 1122 determines that the loop count of the program has not reached the maximum value (step S210, NO), the control circuit 1122 updates the program voltage VPGM with (VPGM+ΔVx), and returns to step S207.

Specific Example of Data Write Operation According to Eighth Embodiment

Hereinafter, a specific example of the data write operation according to the eighth embodiment will be described with reference to FIG. 31. The ready/busy shown in FIG. 31 indicates the ready/busy of the NAND flash memory 1120.

[Time T0]

At time T0, the NAND flash memory 1120 receives the command sequence related to the lower page from the memory controller 1110.

[Time T1]

At time T1, when it is determined that the wait command (1A) is included in the command sequence, the control circuit 1122 waits until the command sequence related to the upper page is received, without performing the write operation of the lower page.

The control circuit 1122 develops the data of the lower page in the third cache 1125c. In the meantime, the NAND flash memory 1120 is in the busy state.

[Time T2]

At time T2, when the development of the data of the lower page in the third cache 1125c is completed, the NAND flash memory 1120 is in the ready state.

[Time T3]

At time T3, when the command sequence related to the upper page is received from the memory controller 1110, the control circuit 1122 starts the 2-bit program operation (full sequence).

Advantage of Data Write Operation According to Eighth Embodiment

According to the above-described embodiment, the memory controller 1110 postpones for the write operation of the lower page of the NAND flash memory 1120 by using the wait command (1A). The memory controller 1110 causes the NAND flash memory 1120 to perform the 2-bit program operation by inputting the command sequence related to the upper page to the NAND flash memory 1120.

As described above, in the present embodiment, since the 2-bit program is performed without performing the write operation of the lower page, it is possible to provide the high-quality memory system 1100 capable of performing the write operation at a higher speed than in the case where the write operation is performed bit by bit.

9. Ninth Embodiment

Figure 32:
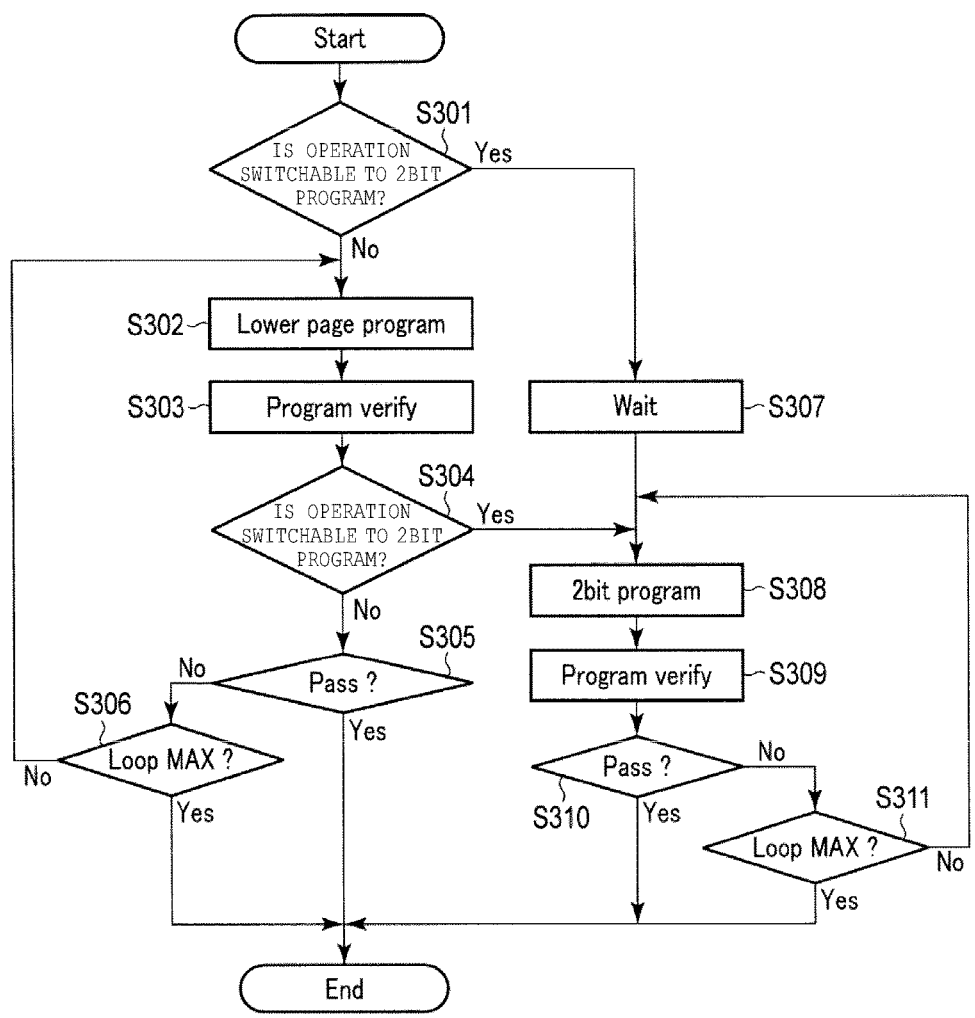
FIG. 32 is a flowchart of a write operation according to a ninth embodiment.

Hereinafter, a memory system 1100 according to a ninth embodiment will be described with reference to FIG. 32. In the ninth embodiment, an operation of combining the seventh embodiment with the eighth embodiment will be described. In the ninth embodiment, the elements having the substantially same functions and configurations as those in the above-described seventh embodiment and eighth embodiment will be described with the same reference numerals, and the redundant description thereof will be performed only when necessary.

Data Write Operation According to Ninth Embodiment

A data write operation according to a ninth embodiment will be described with reference to FIG. 32. Processes shown in FIG. 32 are mainly performed by the control of the control circuit 1122.

[S301]

The control circuit 1122 performs the same operation as that in step S201.

[S302]

The control circuit 1122 performs the same operation as that in step S202 (step S301, NO).

[S303]

Subsequently, the row decoder 1128 performs the same operation as that in step S203.

[S304]

Subsequently, the control circuit 1122 performs the same operation as that in step S103.

[S305]

The control circuit 1122 performs the same operation as that in step S104 (step S304, NO).

[S306]

Subsequently, the control circuit 1122 performs the same operation as that in step S105 (step S305, NO).

[S307]

The control circuit 1122 performs the same operation as that in step S206.

[S308]

The control circuit 1122 performs the same operation as that in step S106 or S207 (step 304 or S301, YES).

[S309]

The row decoder 1128 performs the same operation as that in step S107.

[S310]

The control circuit 1122 performs the same operation as that in step S108.

[S311]

The control circuit 1122 performs the same operation as that in step S109 (step S310, NO).

Advantage of Data Write Operation According to Ninth Embodiment

According to the above-described embodiment, the data writing method according to the seventh embodiment and the data writing method according to the eighth embodiment are combined. Thus, it is possible to obtain the advantage of the seventh embodiment and the eighth embodiment.

10. Tenth Embodiment

Figure 33:
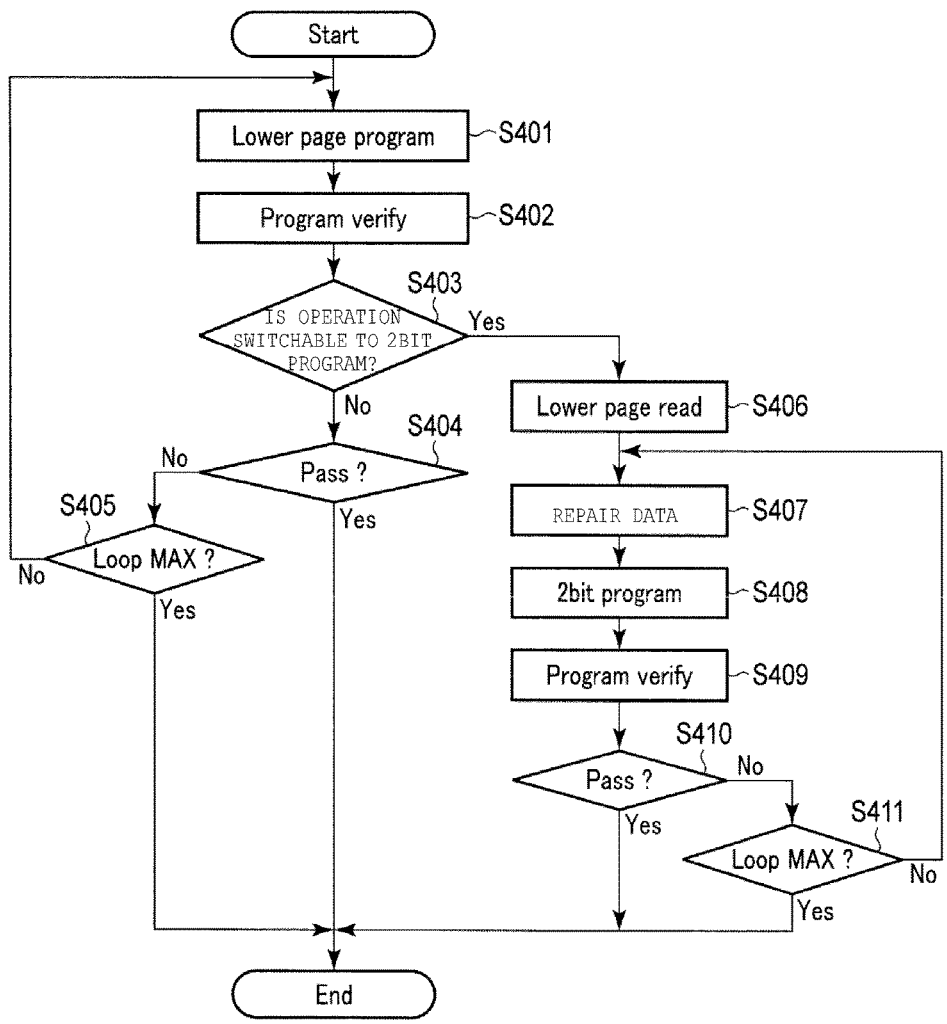
FIG. 33 is a flowchart of a write operation according to a tenth embodiment.

Hereinafter, a memory system 1100 according to a tenth embodiment will be described with reference to FIG. 33. In the tenth embodiment, data of the lower page are corrected when the verify operation is Fail at the time of the write operation of the lower page in the seventh embodiment. In the tenth embodiment, the elements having the substantially same functions and configurations as those in the above-described seventh embodiment will be described with the same reference numerals, and the redundant description thereof will be performed only when necessary.

Data Write Operation According to Tenth Embodiment

Hereinafter, a data write operation according to a tenth embodiment will be described with reference to FIG. 33. Processes shown in FIG. 33 are mainly performed by the control of the control circuit 1122.

[S401] to [S405]

The same operations as those in steps S101 to S105 are performed.

[S406]

The control circuit 1122 performs a check-read operation on a current cell state after the write operation of the lower page is performed via the sense amplifier 1126. The control circuit may use the program verify result remaining in the third cache 1125*c* without performing the check-read operation.

As shown in FIG. 34, the program verify result (lower page program result) is stored in the third cache 1125*c*. In FIG. 34, "P" represents a verify pass bit, and "F" represents a verify fail bit. The lower page data are stored in the second cache 1125*b*. In FIG. 34, it is assumed that the lower pages of bit2 and bit6 is Fail.

[S407]

Here, the control circuit 1122 repairs the Fail of the lower page by the following three methods. Here, although not described in detail, it is possible to repair errors corresponding to a predetermined number of bits by adding, for example, a page ECC parity to data for each page and performing the operation in the ECC circuit 1113. Accordingly, in the NAND flash memory 1120, the change of the write data and the neglecting of bits in which the write operation is not completed can be allowed within a range in which the data correction can be performed by the ECC circuit 1113. Here, the repair means that the data are modified or the criterion of the program verify operation is changed.

{Repairing Method 1}

In FIG. 34, bit2 is a bit in which the data of the lower page are "0", the data of the upper page are "0" and the final arrival position of the threshold voltage distribution is a "B" level. However, in a step of switching the operation from the lower-page write operation to the 2-bit write operation, specifically, step S406, if it can be determined that the threshold voltage distribution exceeds an A distribution, the control circuit 1122 performs a process of changing the data of the lower page of bit2 from data "0" to data "1". Thus, in the 2-bit program, bit2 can be processed as being a bit error of the data of the lower page.

{Repairing Method 2}

There is a possibility that the bit of the lower page which is Fail in the program verify operation is an error bit that cannot be properly written, and there is a possibility that this bit will be Fail in the program verify operation of the write operation of the upper page. Here, the control circuit 1122 modified the data of the upper page and the lower page in a step of switching the operation to the 2-bit write operation. Specifically, in FIG. 35, bit6 is a bit in which the data of the lower page are "0", the data of the upper page are "1" and the final arrival position of the threshold voltage distribution is a "C" level. Here, the control circuit 1122 performs a process of modifying the write data of the lower page of bit6 from data "0" to data "1". Thus, in the 2-bit write operation, bit6 is in a non-write state, and the write operation is not performed.

{Repairing Method 3}

In Repairing Method 1 and Repairing Method 2, the method of modifying the data of the upper or lower page in the step of switching the operation to the 2-bit program operation has been described. In Repairing Method 3, the criterion of whether or not the program verify operation is Pass is changed based on the result of the check-read operation of the current cell state or the result of the program verify operation remaining in the third cache 1125*c* without modifying the data of the upper page or the lower page.

The control circuit 1122 may appropriately select Repairing Method 1, Repairing Method 2, or Repairing Method 3 based on the progress of the write operation, specifically, a plurality of criteria such as the number of fail bits or the loop count.

A specific method of processing the write data will be described below. In FIG. 36, it is assumed that P indicates "1", and F indicates "0" in the Lower Page program result stored in the third cache 1125*c*.

Repairing Method 1 is achieved by inverting the OR operation result of the second cache 1125*b* which stores the write data of the lower page and the first cache 1125*a* which stores the data of the upper page, performing an AND operation of the resultant and the inverted data which is the result of the program verify operation performed on the lower page stored in the third cache 1125*c*, and performing the OR operation of the operation result and the write data of the lower page stored in the second cache 1125*b*.

Thus, the bit which is Fail in the program verify operation at the time of the write operation of the lower page is changed from "0" to "1", and the 2-bit write operation is started using the changed data.

Repairing Method 2 is achieved by inverting the result of the program verify operation of the lower page stored in the third cache 1125*c* and performing the OR operation of the second cache 1125*b* which stores the write data of the lower page and the first cache 1125*a* which stores the write data of the upper page.

Thus, data are in the non-write state by changing the bit which is Fail in the program verify operation at the time of the write operation of the lower page from "0" to "1", and the 2-bit write operation is started using the changed data.

Referring to FIG. 36, in Repairing Method 3, bit6 and bit2 are bits which are Fail in the program verify operation in the write operation of the lower page. The final arrival position of the threshold voltage distribution of bit6 is "C", and the final arrival position of the threshold voltage distribution of bit2 is "A". Thus, in the determination of the program verify operation after the operation is changed to the 2-bit write operation, specifically, in the determination of step S410, the number related to the number of fail bits of the program verify operation or the result of the check-read operation of the lower page is added to the number of set allowable bits.

More specifically, the control circuit 1122 may set the number of allowable bits to each threshold voltage distribution in the determination of step S410. In such a case, the control circuit 1122 uses a set allowable number for the threshold voltage distribution of A. The control circuit 1122 sets the allowable number obtained by adding 1 to the set allowable number in association with the number of fail bits of the lower bit to the threshold voltage distribution of B. The control circuit 1122 sets the allowable number obtained by adding 1 to the set allowable number in association with the number of fail bits of the lower bit to the threshold voltage distribution of C.

The control circuit 1122 may set the allowable bit number to not the threshold voltage distribution but the entire 2-bit write operation. In such a case, the control circuit 1122 sets the allowable number obtained by adding 2 to the set allowable number in association with the fail bits of the write operation of the lower page.

The set allowable number is a value set in the circuit or a value registered in the known fuse.

[S408] to [S410]

The same operations as those in steps S106 to S108 are performed.

[S411]

The same operation as that in step S109 is performed, and when the loop count is not the maximum value, the process is returned to step S407.

Advantage of Data Write Operation According to Tenth Embodiment

According to the above-described embodiment, the processing method is changed depending on the upper page related to the lower page which is Fail.

Incidentally, there is a limitation in the repairing method performed by the ECC circuit 1113, and when the number of fails bits exceeds the number of bits that can be repaired by the page ECC parity, it is not possible to repair the Fail of the lower page.

However, according to the above-described embodiment, it is possible to reduce the number of bits required to be repaired.

Since the write operation is not previously performed on the bits having a possibility that Fail will occur, the write operation on the bit having a long writing time is previously prevented. As a result, it is possible to prevent the degradation of system performance, specially, writing performance.

It is possible to prevent the degradation of the writing performance by changing the criterion for determining whether or not the program verify operation is Pass or Fail based on the result of the write operation of the lower page or setting an appropriate criterion for determining whether or not the program verify operation is Pass or Fail to the page.

Since it is possible to obtain the same effect as that in the seventh embodiment, it is possible to provide the high-quality memory system 1100 capable of performing the write operation at a higher speed.

The tenth embodiment can use the combination of the eighth embodiment and the ninth embodiment.

11. Modification Examples

The memory system of the above-described embodiments includes the semiconductor memory device (100 of FIG. 1), and the controller (200 of FIG. 1). The semiconductor memory device includes the plurality of first memory cells (MT of FIG. 3) that is able to store first and second bits, the first memory cell array (111_0 of FIG. 3) that includes the plurality of first memory cells, and includes the first memory cell unit which is able to store the first page (Data1_0 of FIG. 6) corresponding to the first bit and the second page (Data2_0 of FIG. 6) corresponding to the second bit, the first sense amplifier (115_0 of FIG. 2) that is connected to the first memory cell array, the first cache (116_0 of FIG. 2) that stores one of the first and second pages transmitted from the controller, the second cache (117_0 of FIG. 2) that is connected to the first sense amplifier, and stores the first page transmitted from the first cache, and the third cache (118_0 of FIG. 2) that is connected to the first sense amplifier, and stores the second page transmitted from the first cache. The first page data stored in the second cache and the second page data stored in the third cache are written in the first memory cell array in response to the first command (C4 of FIG. 6). The controller is able to transmit the second address signal (Address2_0 of FIG. 6) corresponding to the second page to the semiconductor memory device before the first address signal (Address1_0 of FIG. 6) corresponding to the first page is transmitted. The semiconductor memory device stores the first page in the second cache in response to the first address signal, and stores the second page in the third cache in response to the second address signal.

It is possible to provide the semiconductor memory device and the memory system capable of improving the processing capability by applying the above-described embodiments.

Embodiments are not limited to the above-described embodiments, and may be variously modified.

11.1 First Modification Example

Although the information indicating the first page or the second page is included in the address signal in the above-described embodiments, the information indicating the first page or the second page may be transmitted as a prefix command from the controller 200. The present example will be described with reference to FIGS. 18 and 19.

Figure 18:
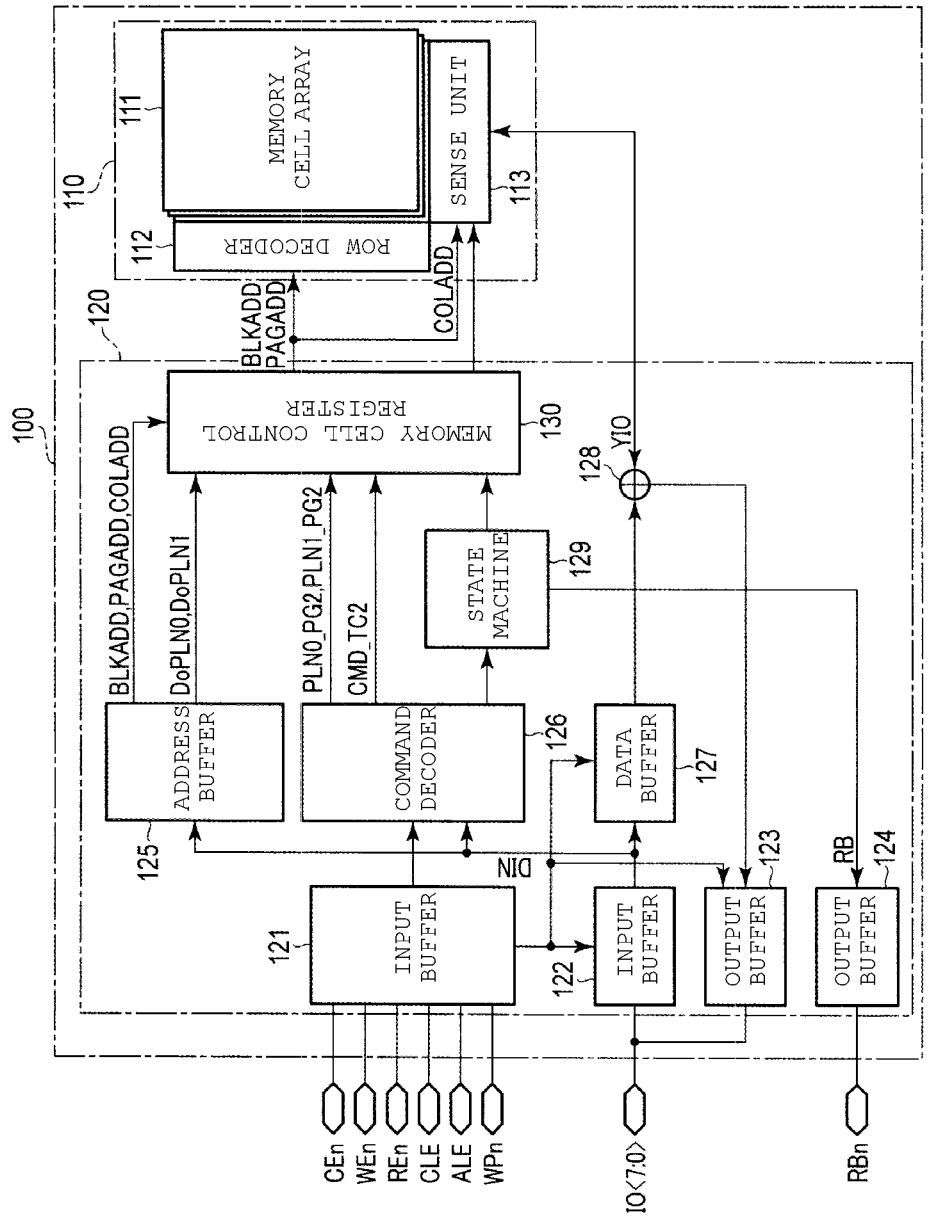
FIG. 18 is a block diagram of a memory system according to a first modification example.

As shown in FIG. 18, a difference from FIG. 2 of the first embodiment is that since the NAND flash memory 100 receives the information of the first page and the second information as the command, the signal PLN0_PG2 and the signal PLN1_PG2 are transmitted to the memory cell control register 130 from the command decoder 126.

Figure 19:
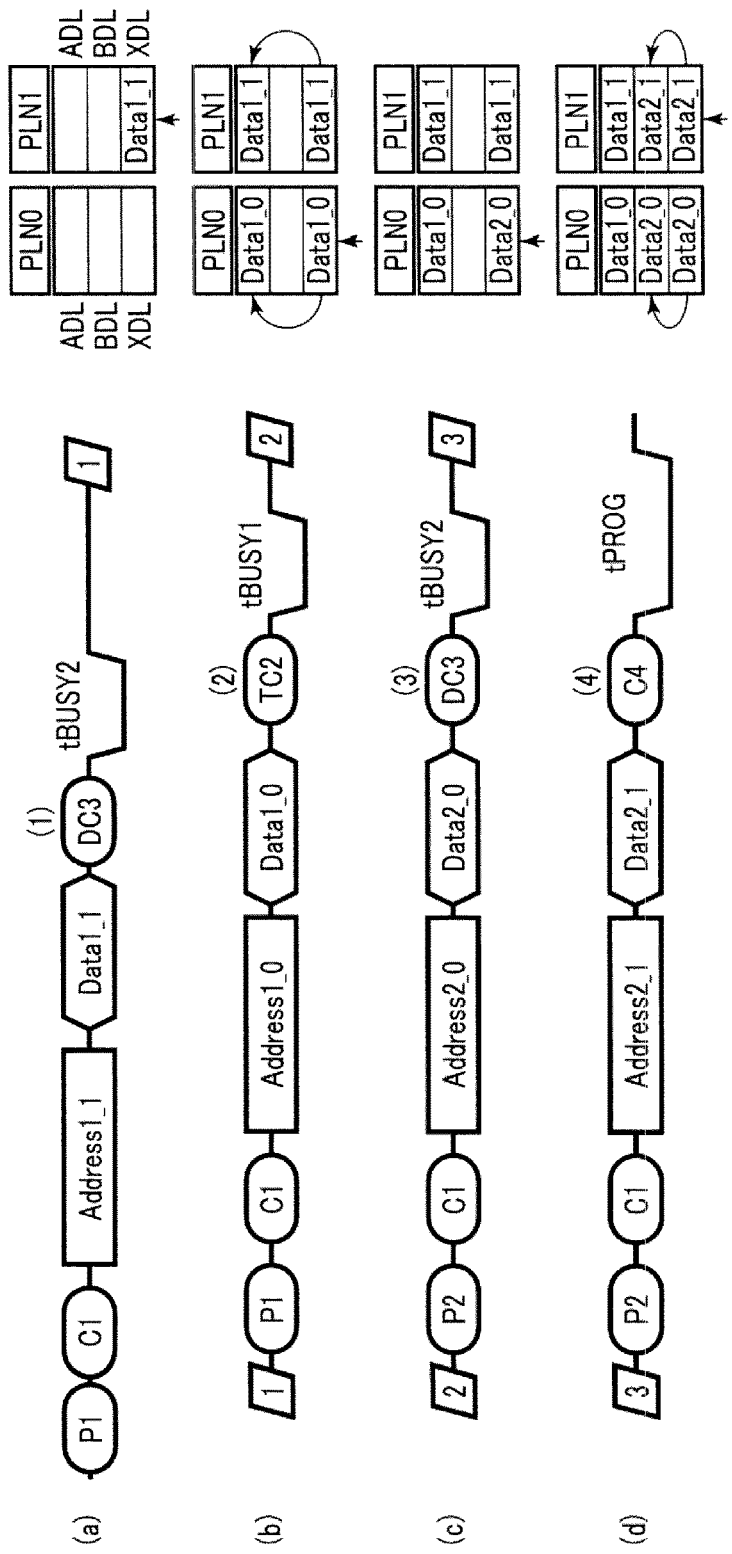
FIG. 19 illustrates a sequence of commands and data transmitted during a data writing operation and a stored state of data in a sense unit of a semiconductor memory device in the memory system according to the first modification example.

As shown in FIG. 19, when the data are transmitted to the NAND flash memory 100 from the controller 200, a command "P1" indicating the first page or a command "P2" indicating the second page is added as the prefix command before the command "C1".

11.2 Second Modification Example

Although the controller 200 transmit the command "DC3" for the first and third data transmissions in the first embodiment as shown in FIG. 6, the controller 200 may transmit the command "TC2" instead. The present example will be described with reference to FIGS. 20 and 21.

Figure 20:
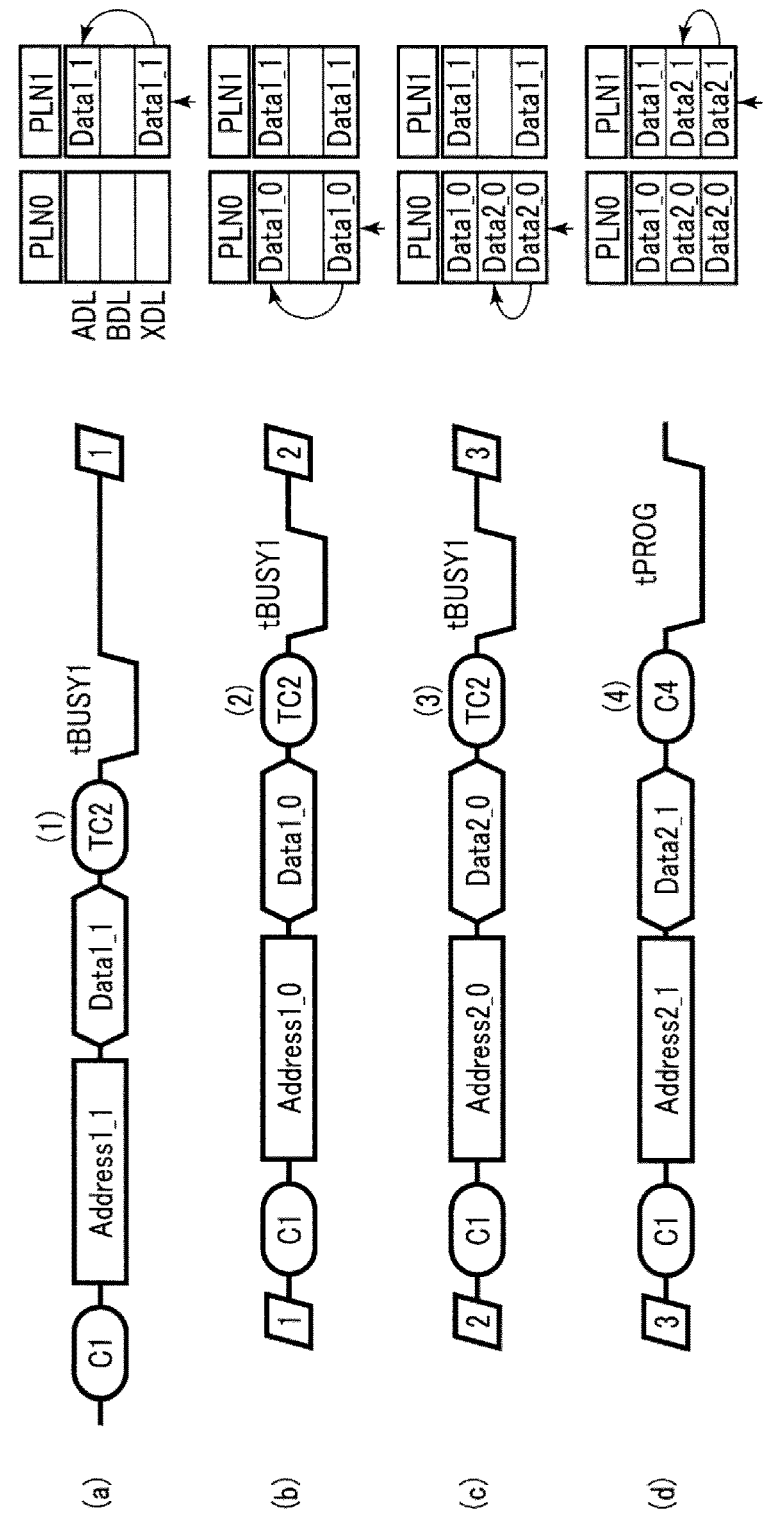
FIG. 20 illustrates a sequence of commands and data transmitted during a data writing operation and a stored state of data in a sense unit of a semiconductor memory device according to a second modification example.

As shown in FIGS. 20 and 21, the controller 200 transmits the command "TC2" for the first and third data transmissions (reference numerals (a) and (c) of FIG. 20). The signal CMD_TC2 is also set to be at an "H" level so as to correspond to the command "TC2". Thus, after the first data reception is performed (reference numeral (1) of FIGS. 20 and 21), in the sense unit 113, the data "Data1_1" stored in the first cache 116_1 are transmitted to the second cache 117_1 in the plane PLN1. After the third data reception is performed (reference numeral (1) of FIGS. 20 and 21), in the sense unit 113, the data "Data2_0" stored in the first cache 116_0 are transmitted to the second cache 117_0 in the plane PLN0.

11.3 Third Modification Example

Although the controller 200 sequentially transmits the data to the first page of the plane PLN1, the first page of the plane PLN0, the second page of the plane PLN0, and the second page of the plane PLN1 in the first embodiment, the data transmission order may be arbitrarily changed. A combination of data transmission orders may be described in detail.

Initially, when the first data transmission is carried out, data corresponding to one of the four pages (the first and second pages of the plane PLN0 and the first and second pages of the plane PLN1) are transmitted.

Subsequently, when the second data transmission is carried out, data corresponding to one of the three pages that are not transmitted in the transmission of the first data are transmitted. For example, when the data of the first page of the plane PLN0 are transmitted in the transmission of the first data, data corresponding to one of the three pages (the second page of the plane PLN0 and the first and second pages of the plane PLN1) are transmitted.

Subsequently, when the third data are transmitted, data corresponding to one of the two pages that are not transmitted in the first and second data transmissions. For example, when the data of the first page of the plane PLN0 is transmitted in the first data transmission and the data of the second page of the plane PLN1 are transmitted in the second data transmission, data corresponding to one of the two pages (the second page of the plane PLN0 and the first page of the plane PLN1) are transmitted.

Subsequently, when the fourth data transmission is carried out, data of the page that are not transmitted in the first to third data transmissions. For example, when the data of the first page of the plane PLN0 are transmitted in the first data transmission, the data of the second page of the plane PLN1 are transmitted in the second data transmission and the data of the first page of the plane PLN1 are transmitted in the third data transmission, data of the second page of the plane PLN0 are transmitted.

Thus, when the controller 200 transmits the data of the four pages (the first and second pages of the planes PLN0 and PLN1), there are 24 (=4×3×2) combinations of transmission orders.

When the overwrite operation or the OR operation is performed on the data in the transmission of each data unit as described in the second embodiment or when there is no data of the page as described in the third embodiment, the number of combinations of data transmission orders is further increased.

11.4 Other Modification Examples

The above-described embodiments are merely examples, and the respective embodiments may be variously modified. The respective embodiments may be combined as possible. For example, the second embodiment and the sixth embodiment may be applied to the configuration according to the first embodiment. The data stored in the second cache 117 may be read into the controller 200, and the ECC process may be performed on the data. Thereafter, the processed data may be transmitted to the second cache 117 again, and the write operation may be performed on the data.

The "transmission" in the above-described embodiments includes a case where data are moved, and a case where data are copied. Specifically, for example, when the data are transmitted to the second cache 117 or the third cache 118 from the first cache 116, the data may be stored or may be erased in the first cache 116 after the data are transmitted.

The above-described embodiments may be applied to any one of the plane NAND flash memory or the three-dimensional stacked NAND flash memory.

In the seventh to tenth embodiments, the write operation of the two-valued data is switched to the write operation of the four-valued data, or writing of the four-valued data are carried out from the beginning. However, these embodiments are not limited to the above-described example. When ultra multi-valued data are used, for example, the same method may be used when the write operation of the two-valued data is switched to the write operation of the eight-valued data, when the write operation of the four-valued data is switched to the write operation of the eight-valued data, and when the eight-valued data is initially written. In other words, the above-described seventh to tenth embodiments may be applied to a case where the memory cell transistor MT is able to store data having a data length of 2 bits or more.

Although the data latch circuit 1125 includes three caches in the seventh to tenth embodiments that, the embodiments are not limited thereto. The data latch circuit may include at least two or more caches.

The "connection" in the above-described embodiments includes a state elements are indirectly connected with another element such as a transistor or a resistor interposed therebetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The embodiments according to the present invention may be provided as follows.

(1) In the read operation, a voltage applied to a word line selected in a read operation at an A level is, for example, in a range of from 0 V to 0.55 V. The voltage is not limited to the above-described example, and may be in any range of from 0.1 V to 0.21 V, from 0.21 V to 0.31 V, from 0.31 V to 0.4 V, from 0.4 V to 0.5 V, and from 0.5 V to 0.55 V.

A voltage applied to a word line selected in a read operation at a B level is, for example, in a range of from 1.5 V to 2.3 V. The voltage is not limited to the above-described example, and may be in any range of from 1.65 V to 1.8 V, from 1.8 V to 1.95 V, from 1.95 V to 2.1 V, and from 2.1 V to 2.3 V.

A voltage applied to a word line selected in a read operation at a C level is, for example, in any range of from 3.0 V to 4.0 V. The voltage is not limited to the above-described example, and may be in any range of from 3.0 V to 3.2 V, from 3.2 V to 3.4 V, from 3.4 V to 3.5 V, from 3.5 V to 3.6 V, and from 3.6 V to 4.0 V.

The period of time (tR) for the read operation may be, for example, in a range of from 25 μs to 38 μs, from 38 μs to 70 μs, or from 70 μs to 80 μs.

(2) The write operation includes the program operation, and the verify operation, as described above. In the write operation, a voltage initially applied to a word line selected at the time of the program operation is, for example, in a range of from 13.7 V to 14.3 V. The voltage is not limited to the above-described example, and may be, for example, in any range of from 13.7 V to 14.0 V, and from 14.0 V to 14.6 V.

A voltage initially applied to a selected word line when an odd-numbered word line is written and a voltage initially applied to a selected word line when an even-numbered word line is written may be changed.

When the program operation is an incremental step pulse program (ISPP), for example, about 0.5 V is used as a step-up voltage.

A voltage applied to the non-selection word line may be, for example, in a range of from 6.0 V to 7.3 V. The voltage is not limited to the above-described example, and the voltage may be, for example, in a range of from 7.3 V to 8.4 V, or may be 6.0 V or less.

A pulse voltage to be applied may be changed depending on whether or not the non-selection word line is an odd-numbered word line or an even-numbered word line.

The period of time (tProg) for the write operation may be, for example, in a range of from 1,700 µs to 1,800 µs, from 1,800 µs to 1,900 µs, or from 1,900 µs to 2,000 µs.

(3) In the erase operation, a voltage initially applied to a well, which is formed on the semiconductor substrate and on which the memory cell, is arranged is, for example, in a range of from 12 V to 13.6 V. The voltage is not limited to the above-described example, and the voltage may be, for example, in a range of from 13.6 V to 14.8 V, from 14.8 V to 19.0 V, from 19.0 V to 19.8 V or from 19.8 V to 21 V.

The period of time (tErase) for the erase operation may be, for example, in a range of from 3,000 µs to 4,000 µs, from 4,000 µs to 5,000 µs, or from 4,000 µs to 9,000 µs.

(4) The memory cell has a structure in which a charge storage layer is arranged on the semiconductor substrate (silicon substrate) with a tunnel insulating film having a film thickness of from 4 nm to 10 nm interposed therebetween. The charge storage layer can have a stacked structure of an insulating film such as SiON or SiN having a film thickness of from 2 nm to 3 nm and polysilicon having a film thickness of from 3 nm to 8 nm. Metal such as Ru may be added to the polysilicon. An insulating film is formed on the charge storage layer. The insulating film includes, for example, a silicon oxide film having a film thickness of from 4 nm to 10 nm interposed between a lower high-k film having a film thickness of from 3 nm to 10 nm and an upper high-k film having a film thickness of from 3 nm to 10 nm. The high-k film is made of HfO. The film thickness of the silicon oxide film may be greater than the thickness of the high-k film. A control electrode having a film thickness of from 30 nm to 70 nm is formed on the insulating film with a material which has a film thickness of from 3 nm to 10 nm and is used to adjust a work function interposed therebetween. Here, the material for adjusting a work function is a metal oxide film made of TaO, or a metal nitride film made of TaN. The control electrode may be made of W.

What is claimed is:

1. A memory system comprising:
a semiconductor memory device including a plurality of memory cells, and first, second, and third caches for storing data before the data are written into the memory cells; and
a memory controller configured to issue commands to the semiconductor memory device, the commands including a first command issued with first write data to store the first write data in the first cache, a second command issued with second write data to store the second write data in the first cache and then transfer the second write data in the first cache to one of the second and third caches, and a third command to transfer data between the second and third caches.

2. The memory system according to claim 1, wherein the semiconductor memory device, in response to the first command issued with the first write data, stores the first write data in the first cache.

3. The memory system according to claim 2, wherein the semiconductor memory device, in response to the second command issued with the second write data, stores the second write data in the first cache and then transfers the second write data in the first cache to one of the second and third caches.

4. The memory system according to claim 3, wherein a time period for executing the first command in the semiconductor memory device is less than a time period for executing the second command in the semiconductor memory device.

5. The memory system according to claim 1, wherein the memory controller issues the first command with first address data, the first address data indicating one of the second and third caches as a destination of the first write data, and issues the second command with second address data, the second address data indicating one of the second and third caches as a destination of the second write data.

6. The memory system according to claim 5, wherein the semiconductor memory device, in response to the first and second commands, stores the corresponding first or second write data in the first cache and sets a logic state of a control signal to a first state if the destination of the corresponding first or second write data is the second cache and to a second state if the destination of the corresponding first or second write data is the third cache.

7. The memory system according to claim 6, wherein the semiconductor memory device, in response to the second command, further transfers the second write data in the first cache to the destination.

8. The memory system according to claim 1, wherein the commands include a fourth command issued with fourth write data to store the fourth write data in the first cache, perform a logic operation on the fourth write data and data stored in one of the second and third caches, and store a result of the logic operation in said one of the second and third caches.

9. The memory system according to claim 1, wherein the commands include a fourth command to transfer data stored in one of the second and third caches to the first cache and read the data transferred to the first cache.

10. A memory system comprising:
a semiconductor memory device including
a first group of memory cells and a second group of memory cells,
first, second, and third caches for storing data before the data are written into the memory cells of the first group, and
fourth, fifth, and sixth caches for storing data before the data are written into the memory cells of the second group; and
a memory controller configured to issue commands to the semiconductor memory device, the commands including a first command issued with first address data and first write data to store the first write data in the first or fourth cache in accordance with the first address data, a second command issued with second address data and second write data to store the second write data in the first or fourth cache in accordance with the second address data and then transfer the second write data in the first cache to one of the second and third caches or the second write data in the fourth cache to one of the fifth and sixth caches, and a third command to write the data stored in the second or third cache into the first group of memory cells and the data stored in the fifth or sixth cache into the second group of memory cells.

11. The memory system according to claim 10, wherein the memory controller is configured to issue the first and second commands addressing different groups of memory cells in an interleaved manner.

12. The memory system according to claim 10, wherein the semiconductor memory device, in response to the first command, stores the first write data in the first cache if the first address data indicates the memory cells of the first group are targeted and in the fourth cache if the first address data indicates the memory cells of the second group are targeted, and in response to the second command, stores the second write data in the first cache if the second address data indicates the memory cells of the first group are targeted and in the fourth cache if the second address data indicates the memory cells of the second group are targeted.

13. The memory system according to claim 12, wherein the semiconductor memory device, in response to the first or second command, further sets a logic state of a first control signal if the corresponding first or second address data indicates the memory cells of the first group are targeted and a logic state of a second control signal if the corresponding first or second address data indicates the memory cells of the second group are targeted, the logic state of the first control signal indicating one of the second and third caches as a destination of the corresponding first or second write data in the first cache and the logic state of the second control signal indicating one of the fifth and sixth caches as a destination of the corresponding first or second write data in the fourth cache.

14. The memory system according to claim 13, wherein the semiconductor memory device, in response to the second command, further transfers the second write data in the first cache to one of the second and third caches according to the logic state of the first control signal or the second write data in the fourth cache to one of the fifth and sixth caches according to the logic state of the second control signal.

15. The memory system according to claim 10, wherein the commands include a fourth command issued with fourth address data and fourth write data to store the fourth write data in one of the first or fourth cache in accordance with the fourth address data, initialize the other one of the first or fourth cache, and then transfer the fourth write data in the first cache to one of the second and third caches or the fourth write data in the fourth cache to one of the fifth and sixth caches.

16. A semiconductor memory device, comprising:
a first group of memory cells and a second group of memory cells;
first, second, and third caches for storing data before the data are written into the memory cells of the first group;
fourth, fifth, and sixth caches for storing data before the data are written into the memory cells of the second group; and
a control unit configured to process commands received from an external unit, the commands including a first command issued with first address data and first write data to store the first write data in the first or fourth cache in accordance with the first address data, a second command issued with second address data and second write data to store the second write data in the first or fourth cache in accordance with the second address data and then transfer the second write data in the first cache to one of the second and third caches or the second write data in the fourth cache to one of the fifth and sixth caches, and a third command to write the data stored in the second or third cache into the first group of memory cells and the data stored in the fifth or sixth cache into the second group of memory cells.

17. The semiconductor memory device according to claim 16, wherein the control unit, in response to the first command, stores the first write data in the first cache if the first address data indicates the memory cells of the first group are targeted and in the fourth cache if the first address data indicates the memory cells of the second group are targeted, and in response to the second command, stores the second write data in the first cache if the second address data indicates the memory cells of the first group are targeted and in the fourth cache if the second address data indicates the memory cells of the second group are targeted.

18. The semiconductor memory device according to claim 17, wherein the control unit, in response to the first or second command, further sets a logic state of a first control signal if the corresponding first or second address data indicates the memory cells of the first group are targeted and a logic state of a second control signal if the corresponding first or second address data indicates the memory cells of the second group are targeted, the logic state of the first control signal indicating one of the second and third caches as a destination of the corresponding first or second write data in the first cache and the logic state of the second control signal indicating one of the fifth and sixth caches as a destination of the corresponding first or second write data in the fourth cache.

19. The semiconductor memory device according to claim 18, wherein the control unit, in response to the second command, further transfers the second write data in the first cache to one of the second and third caches according to the logic state of the first control signal or the second write data in the fourth cache to one of the fifth and sixth caches according to the logic state of the second control signal.

20. The semiconductor memory device according to claim 16, wherein the commands include a fourth command issued with fourth address data and fourth write data to store the write data in one of the first or fourth cache in accordance with fourth the address data, initialize the other one of the first or fourth cache, and then transfer the write data in the first cache to one of the second and third caches or the write data in the fourth cache to one of the fifth and sixth caches.

* * * * *